United States Patent
Farrell et al.

(10) Patent No.: US 7,268,339 B1
(45) Date of Patent: Sep. 11, 2007

(54) LARGE AREA SEMICONDUCTOR DETECTOR WITH INTERNAL GAIN

(75) Inventors: Richard Farrell, East Killingly, CT (US); Kofi Vanderpuye, Sommerville, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 141 days.

(21) Appl. No.: 11/238,001

(22) Filed: Sep. 27, 2005

(51) Int. Cl.
*H01L 31/00* (2006.01)

(52) U.S. Cl. .................. 250/214.1; 257/438; 257/496; 257/E31.063; 438/91; 438/965

(58) Field of Classification Search ............. 250/214.1; 257/461, 443, 446, 438, 495, 496
See application file for complete search history.

(56) References Cited

U.S. PATENT DOCUMENTS

| | | | | |
|---|---|---|---|---|
| 3,293,435 A | * | 12/1966 | Huth | ..................... 250/370.01 |
| 3,449,177 A | * | 6/1969 | Huth et al. | .................... 438/58 |
| 3,491,272 A | * | 1/1970 | Huth et al. | .................. 257/496 |
| 5,438,217 A | * | 8/1995 | Ishaque et al. | ............. 257/438 |
| 5,446,408 A | * | 8/1995 | Tedrow et al. | .............. 327/530 |
| 5,500,376 A | * | 3/1996 | Ishaque et al. | ............... 438/73 |
| 5,670,383 A | * | 9/1997 | Piccone et al. | ............... 438/91 |

* cited by examiner

*Primary Examiner*—John R. Lee
(74) *Attorney, Agent, or Firm*—Townsend and Townsend and Crew LLP

(57) ABSTRACT

A method is provided for forming a semiconductor-detection device that provides internal gain. The method includes forming a plurality of bottom trenches in a bottom surface of an n-doped semiconductor wafer; and forming a second plurality of top trenches in a top surface of the semiconductor wafer. The bottom surface and the top surface are opposed surfaces. Each of the bottom trenches is substantially parallel to and substantially juxtaposed to an associated one of the top trenches. The method further includes doping the semiconductor wafer with at least one p-type dopant to form a p-region that defines at least one n-well within the p-region, wherein a p-n junction is formed substantially at an interface of the n-well and the p-region; and removing a portion of the bottom surface to form a remaining-bottom surface, wherein a portion of the n-well forms a portion of the remaining-bottom surface.

45 Claims, 20 Drawing Sheets

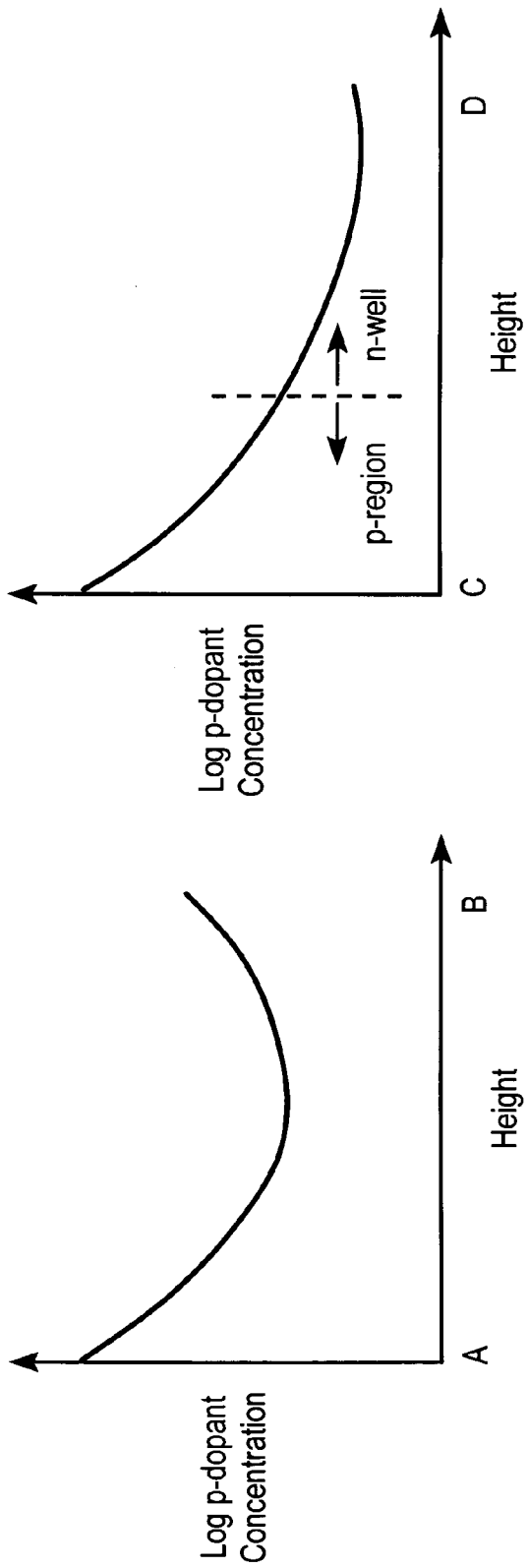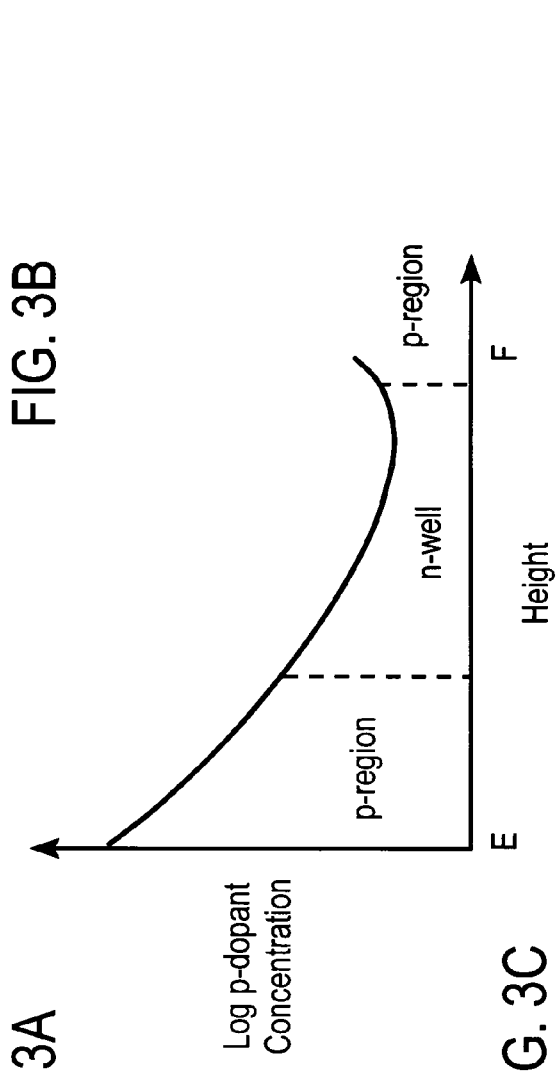
FIG. 3A
FIG. 3B
FIG. 3C

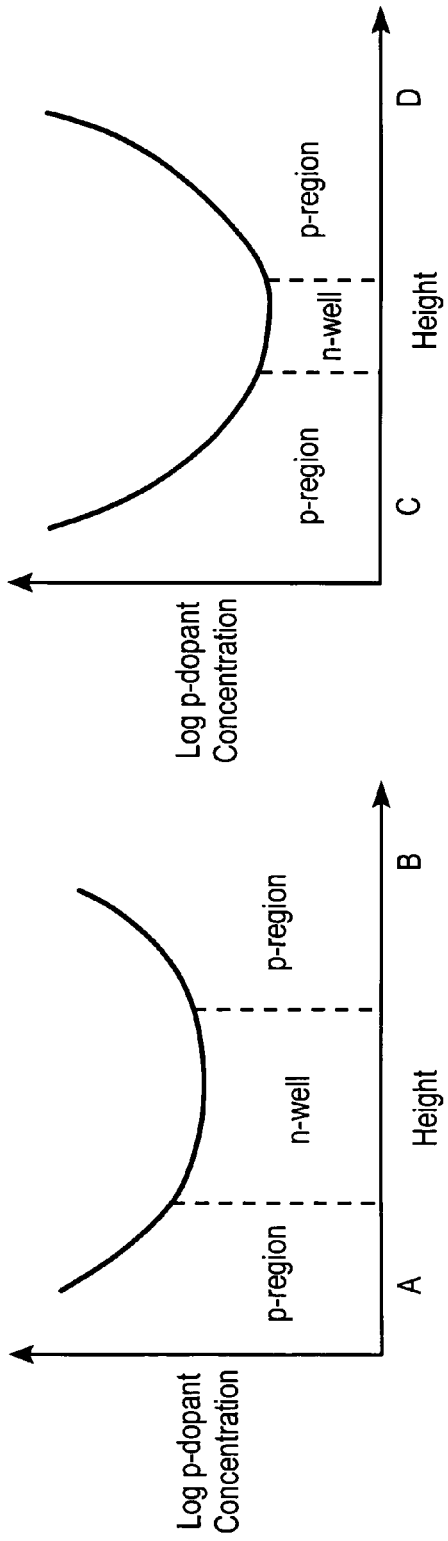
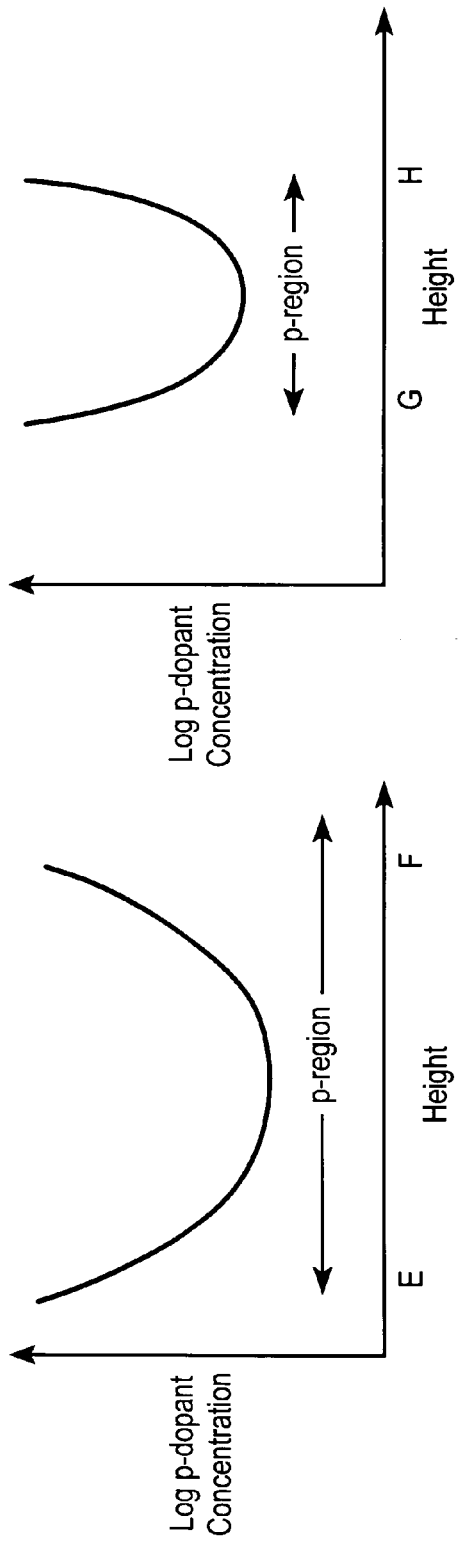

LARGE AREA SEMICONDUCTOR DETECTOR WITH INTERNAL GAIN

BACKGROUND OF THE INVENTION

The present invention relates generally to semiconductor detectors for detecting electromagnetic radiation and configured to provide internal gain from detected radiation. More specifically, the present invention relates to an avalanche photodiode and method of manufacture therefor.

For several decades photomultiplier tubes (PMTs) have been prevalently used for sensing light for medical imaging, particle physics research, and the like. High energy particle physics experiments often include the use of hundreds and even thousands of PMTs to detect particles of various masses, various energies, and various angles of incidence. Different sized PMTs and different sensitivity PMTs are often used in particle detection experiments to provide for the detection of photons and particles having various properties. One example of a detector that includes a number of PMTs is the Super Kamiokande detector in Japan. The Super Kamiokande detector includes an approximately 50,000 ton tank of pure water viewed by over 11,000 photomultiplier tubes that are each approximately 50 centimeters in diameter.

One advantage of PMTs in particle detection applications is their relatively large amplification, which is often about $10^6$. PMTs also provide the advantage of generating relatively low noise signals, which enables these devices to achieve high sensitivity for single particle detection. Although PMTs have been relatively prevalently used for particle detection applications, PMTs also have a number of inherent limitations. Specifically, PMTs are relatively costly, and large PMTs generally are not easy to mass produce. Further, PMTs are generally not operable under pressures exceeding a few atmospheres as the glass from which PMTs are fabricated tends to implode. Further yet, PMT sensitivity is often limited to a relatively small wavelength band, and the optical quantum efficiency of PMTs is also relatively low. Further still, PMTs generally are not operable under relatively high magnetic fields as these magnetic fields tend to push avalanche electrons from their intended paths within the PMTs. And, PMTs tend to be bulky. As a result, in many medical imaging applications, high energy applications, and nuclear physics applications, there remains a need for alternative designs of large photosensors that address the limitations of PMTs.

One solid state substitute for PMTs is the avalanche photodiode (APD). An APD is a semiconductor device that may be reverse biased near the breakdown region of the device such that multiple charges are generated in this region as a result of the absorption of an incident photon. The generated charge is amplified in the APD as a result of a cascading effect as the charge is accelerated by the reverse bias potential applied across the p-n junction of the device. An APD (similar to a PMT) exhibits internal gain created by an impact ionization process in the device, but an APD (disparate from a PMT) exhibits relatively high optical quantum efficiency. For example, the optical quantum efficiency of an APD may be four times (or more) higher than the optical quantum efficiency of a PMT. Further, APDs tend to exhibit a wider spectral response as compared to PMTs. Further yet, APDs tend to be insensitive to externally applied magnetic fields, unlike PMTs.

Early APDs were often discrete devices having beveled edges to prevent premature voltage breakdown at the sides of these APDs to thereby achieve "high" gain. See, for example, the beveled edge APDs described in U.S. Pat. Nos. 3,293,435, 3,491,272, and 3,449,177 of Huth. Specifically, beveled edges are used to reduce the peak surface electric field (i.e., the electric field across the p-n junction in the area where the p-n junction meets the surface of the APD structure) substantially below the peak bulk electric field (i.e., the electric field across the p-n junction in the body of the device where the p-n junction is disposed substantially parallel to the surfaces of the device to which the bias voltage is applied). Reducing the peak surface electric field generally inhibits breakdown at the surfaces and provides, instead, for primary breakdown in the bulk. Breakdown at the surfaces tends not to contribute measurable signal current and tends to contribute leakage currents as well as other undesired effects, such as device noise. For example, the peak surface electric field may have a value about 70% or less than the value of the peak bulk electric field to provide that the APD breaks down in the bulk.

Beveling is typically achieved via manual fabrication processes, such as grinding, and as a result, the cost of fabricating beveled edge APDs is generally high (~$1000 for a 1-2 square centimeter ($cm^2$) device). Relatively large APDs that are typically commercially available and that have this design are typically about 2 $cm^2$ or less. Due to the high cost and relatively small size of beveled edge APDs, these APDs tend not to be suitable for many medical imaging applications and high energy physics applications.

Methods have been investigated to avoid the beveled configuration of APDs. U.S. Pat. Nos. having numbers 5,670,383 and 5,446,408 of Piccone. However, the described APDs in these patents tend to have a relatively thin portion, which renders these APDs relatively fragile. The disclosures of U.S. Pat. Nos. 5,670,383 and 5,446,408 are incorporated by reference herein in their entireties.

Therefore, the need exists for new APDs and new APD manufacturing techniques, wherein the APDs are relatively robust and easy to fabricate at relatively low cost.

BRIEF SUMMARY OF THE INVENTION

A method is provided for forming a semiconductor-detection device that is configured to detect photons and/or particles and provide internal gain from detected photons and/or a detected particle. The method includes forming a plurality of bottom trenches in a bottom surface of an n-doped semiconductor wafer; and forming a second plurality of top trenches in a top surface of the semiconductor wafer. The bottom surface and the top surface are opposed surfaces. Each of the bottom trenches is substantially parallel to and substantially juxtaposed to an associated one of the top trenches. The method further includes doping the semiconductor wafer with at least one p-type dopant to form a p-region that defines at least one n-well within the p-region, wherein a p-n junction is formed substantially at an interface of the n-well and the p-region; and removing a portion of the bottom surface to form a remaining-bottom surface, wherein a portion of the n-well forms a portion of the remaining-bottom surface. The method may further include removing a portion of the top surface to form a remaining-top surface, wherein the p-region forms the remaining-top surface. The step of removing the portion of the bottom surface may include a step of mechanically removing material from the bottom surface and a step of etching material from the bottom surface. The step of removing the portion of the top surface may include a step of mechanically removing material from the top surface, and a step of etching material from the top surface.

According to another embodiment, a photodiode includes an n-well extending inward from a bottom surface; and a p-region disposed partially around the n-well such that a p-n junction is disposed substantially at an interface between the n-well and the p-region. The p-region forms a top surface that is opposite to the bottom surface. The p-region and the n-well form the bottom surface. The p-n junction meets the bottom surface at an obtuse angle on the n-well side of the p-n junction. The obtuse angle is between a line parallel to the bottom surface and a line substantially tangent to the p-n junction at the point where the p-n junction meets the bottom surface (or the n-well side of the detector), measured from the n-well direction towards the p-n junction. The obtuse angle may be greater than 90 degrees (absolute value) and no more than 180 degrees (absolute value).

According to another embodiment, a photodiode includes an n-well extending inward from a bottom surface; and a p-region disposed partially around the n-well such that a p-n junction is disposed substantially at an interface between the n-well and the p-region. The p-region forms a top surface that is opposite to the bottom surface. The p-region and the n-well form the bottom surface. Along any straight line extending from the top surface to the bottom surface a concentration of p-dopant, has a first value at the top surface, decreases to a lower value in the bulk of the p-region and n-wells, and increases from the lower value in the bulk to a higher value at the bottom surface. According to a specific embodiment, the p-n junction meets the bottom surface at an obtuse angle on the n-well side of the p-n junction.

An avalanche photodiode array configured to detect incident electromagnetic radiation includes a plurality of n-wells extending inward from a bottom surface; and a p-region that is disposed partially around each of the n-wells, wherein substantially at an interface region between each n-well and the p-region a p-n junction is disposed, wherein the p-region forms a top surface, and the p-region and the n-wells form the bottom surface that is opposite to the top surface, wherein the p-n junctions meets the bottom surface at an obtuse angle on the n-well side of the p-n junction. Portions of the bottom surface between the n-wells electrically isolate adjacent wells along the bottom surface.

Other features and advantages of the invention will be apparent in view of the following detailed description and accompanying figures.

BRIEF DESCRIPTION OF THE DRAWINGS

FIGS. 3A-3C are log graphs of the dopant densities of the p-dopant(s) in the APD along various lines through the APD cross section;

FIGS. 14A-14D are log graphs of the dopant densities of the p-dopant(s) in the wafer;

DETAILED DESCRIPTION OF THE INVENTION

The present invention provides a detector and a fabrication method therefor such that the detector has an internal gain associated with detected electromagnetic radiation and/or various detected particles. More specifically, the present invention provides an avalanche photodiode and method of manufacture therefor.

Figure 1:
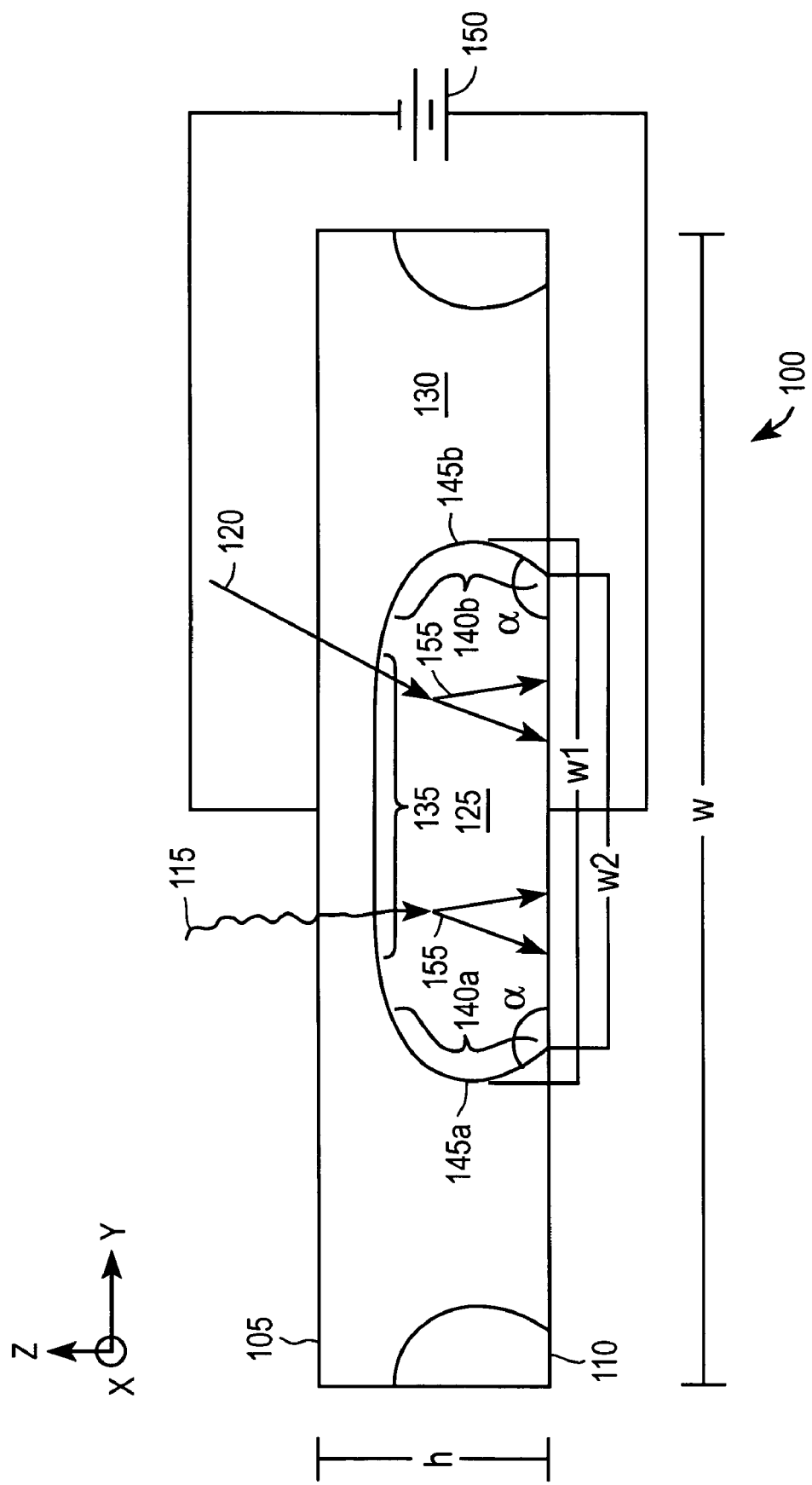
FIG. 1 is a simplified cross-sectional view of an avalanche photodiode according to one embodiment of the present invention.

FIG. 1 is a cross-sectional view of an avalanche photodiode (APD) 100 according to one embodiment of the present invention. APD 100 may be a discrete device or may be integrally formed in an array of APDs. APD 100 may be a semiconductor type device formed from a wafer, such as a silicon wafer, gallium arsenide or the like. The APD includes a top surface 105 and a bottom surface 110. Reference to top and bottom surfaces is made for convenience and should not be understood as a reference to a particular side of the APD from which electromagnetic radiation 115 and/or a particle 120 may be detected.

According to one embodiment, APD 100 includes an n-type material 125 forming an n-well, and a p-type material 130 partially surrounding the n-well and forming a p-region.

The p-region forms the top surface 105 of the APD, and the p-region and the n-well form the bottom surface 110 of the APD. The n-well has a top portion 135 that is substantially flat and concave sidewalls 140a and 140b. The concave sidewalls 140a and 140b respectively have apex points 145a and 145b at which the n-well has a maximum lateral width "w1" (e.g., greater than a width "w2" of the portion of the n-well forming part of the bottom surface 110). Stated alternatively, at the apex points, the n-well has a maximum lateral extension into the p-region. Each of the sidewalls 140a and 140b has a bottom portion that meets bottom surface 110 at an obtuse angle of absolute value "α."

As described briefly above, the n-well meets the p-region along the top portion 135 and the sidewalls 140a and 140b to form a p-n junction. Under a reverse-bias voltage 150 a depletion region (on either side of the p-n junction) is formed and exhibits avalanche gain 155 if the APD detects optical photons and/or a particle. The optical photons may be produced by a single high energy photon or particle interacting in a scintillator that is optically coupled to the APD. The electric field associated with the reverse-bias voltage is relatively higher in the central portion of the p-region and the n-well than at portions of the p-region and n-well adjacent to sidewalls 140. The concave shape of the sidewalls spreads the electric field in the portions of the p-region and the n-well adjacent to the sidewalls and at the sidewalls. Spread of the electric field lines at and adjacent to the sidewalls provides that breakdown of the p-n junction will be relatively low adjacent to the sidewalls as compared to central portions of the p-n junction. Spread of the electric field lines further limits the crosstalk between adjacent APDs that may be formed as an array of APDs on a single wafer.

According to one embodiment of the present invention, the height "h" of APD 100 is approximately 160 micrometers to approximately 350 micrometers. According to another embodiment of the present invention, the height h of APD 100 is approximately 30 micrometers to approximately 2000 micrometers. According to a specific embodiment of the present invention, the height h of the APD is approximately 290 micrometers. The width "w" of the APD (along both the x and y axes) may range from 5 micrometers to 1 centimeter or greater. In FIG. 1, the x-axis is shown as extending upward from the plane of the page, and the y- and z-axes are in the plane of the page.

Figure 2A:
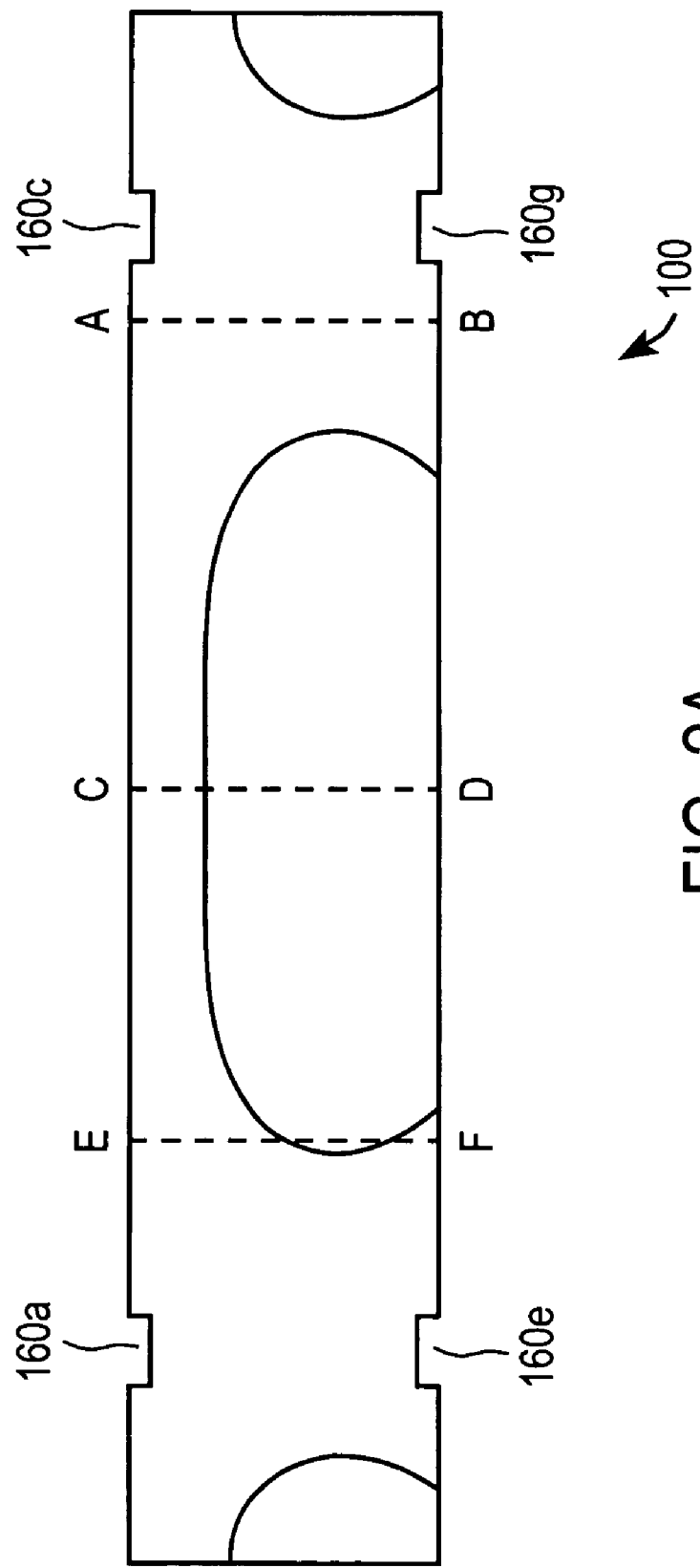
FIGS. 2A and 2B are a cross-sectional view and a perspective view of another avalanche photodiode having top surface trenches and bottom surface trenches according to another embodiment of the present invention.
Figure 2B:
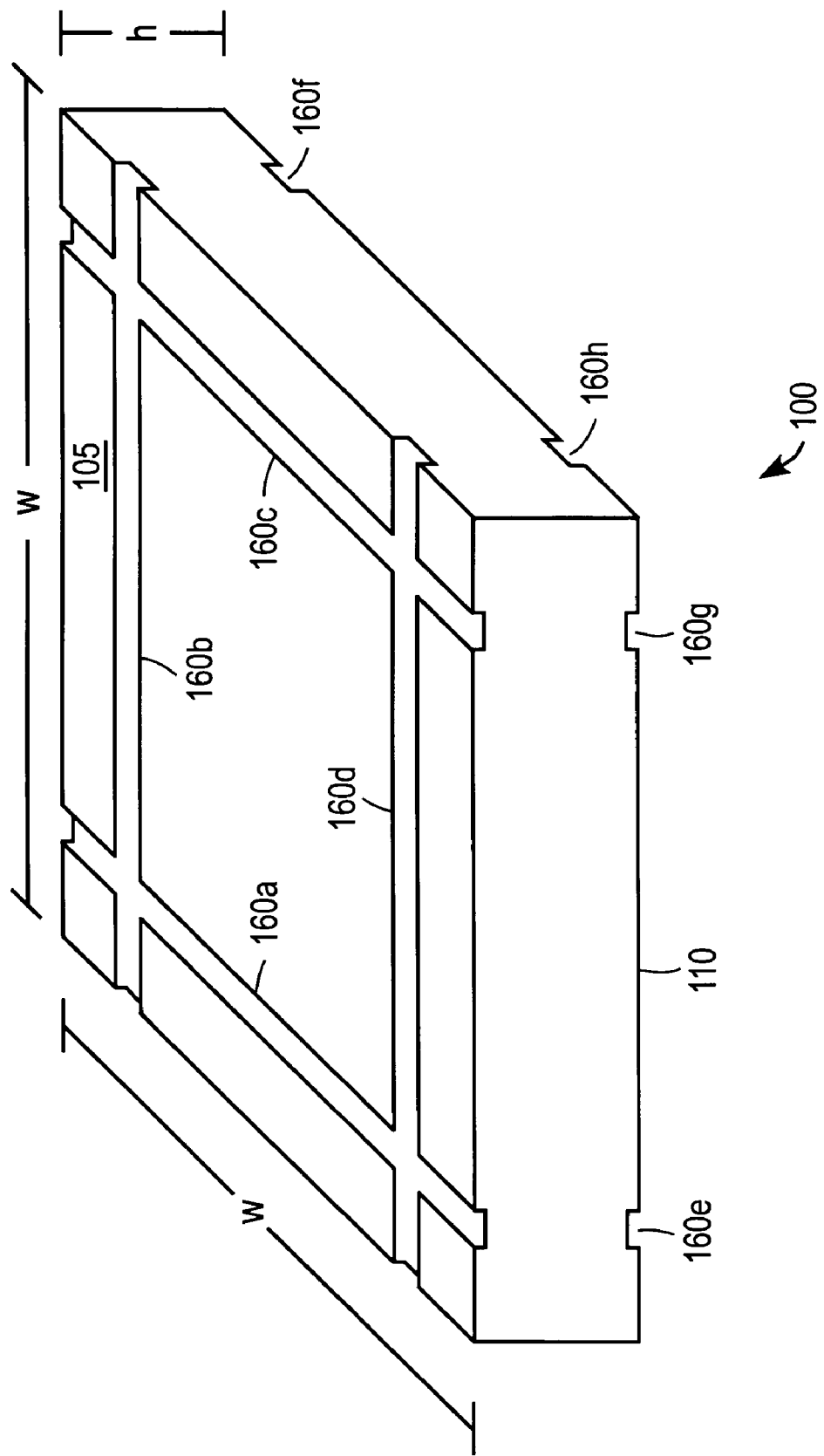

According to another embodiment, the top surface and/or the bottom surface may have trenches 160 formed therein (see FIGS. 2A (cross-sectional view) and 2B (perspective view)). Each trench is labeled with the reference numeral 160 and an alphabetic suffix. Trenches that are oppositely disposed along the top and bottom surfaces may be substantially parallel and substantially aligned in the primary plane of the device. For example, trenches 160a and 160e may be substantially parallel, and trenches 160c and 160g may be substantially parallel. Trenches in the top and bottom surfaces may have equal or disparate depths. Formation of the trenches and of the APD is described in detail below.

According to one embodiment, the n-dopant(s) of the n-material may have a substantially uniform distribution in the n-well and throughout the APD. Alternatively, the density of the n-dopant(s) may be relatively higher at the top and bottom of the n-well than in a substantially central portion (central with respect to the top and bottom surfaces) of the n-well. The density of the p-dopant(s) in the p-region along the line A-B may have a first value at the top surface, drop to a second value at a central portion of the p-region, and increase from the second value to a third value at the bottom surface. The density the p-dopant(s) along the line C-D may have a first value at the top surface and decrease to a second value at in the bulk of the material, and increase in value toward the bottom surface. Alternatively along the line C-D, the density of the p-dopent may increase from the second value in the bulk to a higher value at the bottom surface.

FIGS. 3A-3C are log graphs of the dopant densities of the p-dopant(s) in the APD along various vertical lines (i.e., lines perpendicular to the plane of the top surface and bottom surface) through a cross section through the APD. Specifically, the graph in FIG. 3A shows the density of the p-dopant(s) along the line A-B that runs from the top surface to the bottom surface through the p-region. Along the line A-B, the density of the p-dopant(s) has a first value at the top surface and decreases to a second value in the bulk of the p-region. The density of the p-dopant increases from the second value in the bulk to a third value at the bottom surface. While densities of the p-dopant(s) at the top surface and bottom surface are shown in FIG. 3A as being disparate, these densities may be the same. The graph in FIG. 3B shows the density of the p-dopant(s) along the line C-D that runs from the top surface to the bottom surface through the p-region and the n-well. At the top surface, the density of the p-dopant(s) has a first value that decreases to a second value where the p-region meets the n-well, continues to decrease in the bulk of the n-well, and increases to a third value at the bottom surface. This third value is lower than the second value, but higher than or substantially similar to the lowest value along the line C-D. The graph in FIG. 3C shows the dopant densities of the p-dopant(s) along the line E-F in a portion of the p-region that is adjacent to the n-well and in a side portion of the n-well. As shown in the graph, the density of the p-dopant(s) decreases from a first value at the top surface to a second value where the p-region meets the n-well. In this top portion of the n-well, the p-dopant(s) decrease from the second value to a third value, and then increases to a fourth value (which may be the same as the second value) near the bottom-side portion of the n-well. The density of the p-dopant(s) increases from a fourth value at the bottom-side portion of the n-well to a fifth value at the bottom surface. More generally, along the line E-F, the p-dopent concentration decreases from the top surface to a lower concentration in the bulk of the APD, and increases to a higher concentration (e.g., higher concentration than the lower concentration) at the bottom surface.

As described briefly above and as shown in FIG. 1, detected radiation 115 (e.g., a photon bundle) and/or a particle 120 initiate avalanche multiplication 155 in the depletion region of the APD under a reverse-bias voltage 150. The voltage associated with avalanche multiplication may be detected via a set of bias contacts coupled to the top surface and disposed in the bottom surface of the APD. Bias contacts coupled (e.g., disposed in) to the n-well (or coupled to n+ mesas formed in the n-well) are sometimes referred to herein as positive-bias contacts, and a bias contact coupled to the top surface is sometimes referred to herein as a negative-bias contact.

Figure 4A:
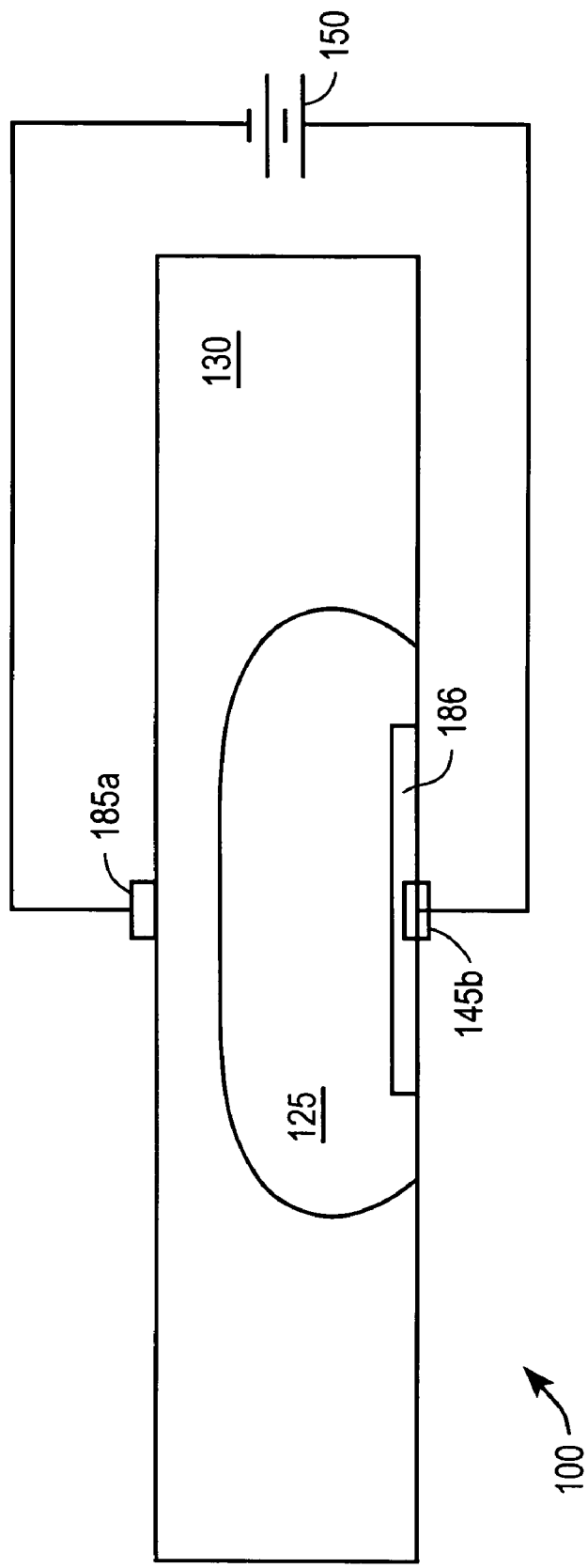
FIG. 4A is a simplified schematic of an APD having a first bias contact coupled to the top surface of the APD, and a second bias contact disposed in the bottom surface of the APD, and more specifically disposed in an n+ mesa formed in an n-well.

FIG. 4A is a simplified schematic of APD 100 having a single bias contact 185a coupled to the top surface, and a single bias contact 185b disposed in the bottom surface. The bias contact in the bottom surface may be disposed in an n+ mesa 186 formed in the n-well. The formation of such n+ mesas is well known in the art and will not be described in detail herein. The bias contact on the top surface may be coupled to an extended conductive region, e.g., a p+ layer, (not shown) formed on the top surface or in a p+ mesa (not shown) formed in the top surface. A high voltage 150 (e.g., 450V to 1800V, or as high as several thousand volts based, for example, on the resistivity of the starting n-type silicon wafer) may be placed across bias contacts 185 to reverse bias the APD. Specifically, bias contact 185*a* may be coupled to a negative-high voltage and bias contact 185*b* may be grounded. Various detection circuitry (such as that described below) may be coupled to the bias contacts and may be configured to detect the voltage from a detected event.

Figure 4B:
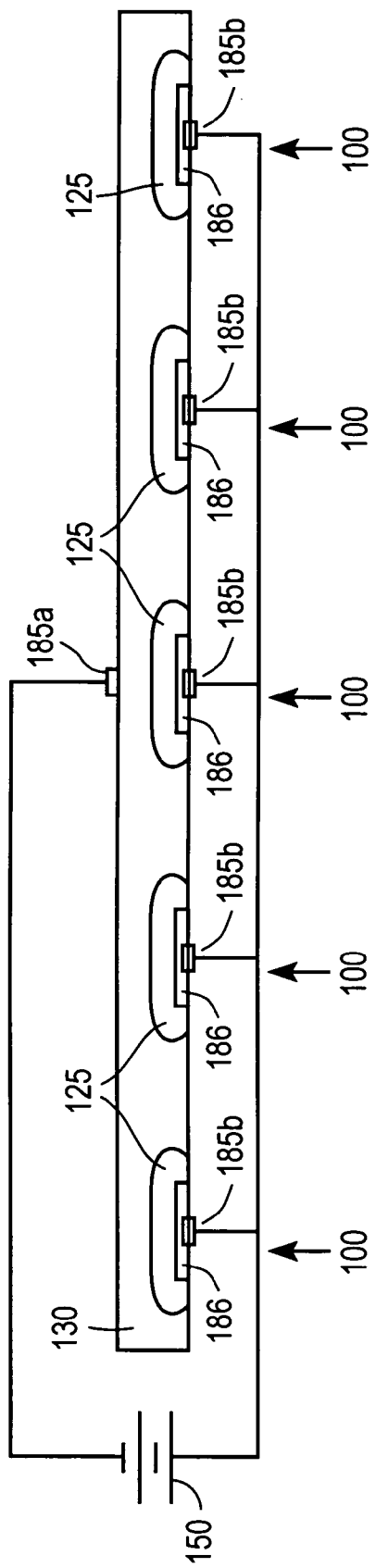
FIG. 4B is a simplified schematic of an array of APDs, wherein a single bias contact is coupled to the top surface of the array, and wherein for each APD in the array, a set of bias contacts is disposed in n+ mesas formed in an n-well of the APD.

FIG. 4B is a simplified schematic of an array of APDs 100, wherein a single bias contact 185*a* is coupled to the top surface of the array (e.g., via an extended conductive region, such as a p+ layer), and a set of bias contacts 185*b* is disposed, respectively, in n+ mesas formed in the n-wells of the APDs. High voltage 150 may be placed across bias contacts 185 to reverse bias the APD. Specifically, bias contact 185*a* may be coupled to a negative-high voltage and each of the bias contact 185*b* may be coupled to ground. Various detection circuitry (such as that described below) may be coupled to the bias contacts and may be configured to detect the voltage from a detected event (e.g., a photon bundle or a particle). The detection circuitry may be configured to determine the particular APD (or APDs) at which photons and/or a particle are detected.

Figure 5A:
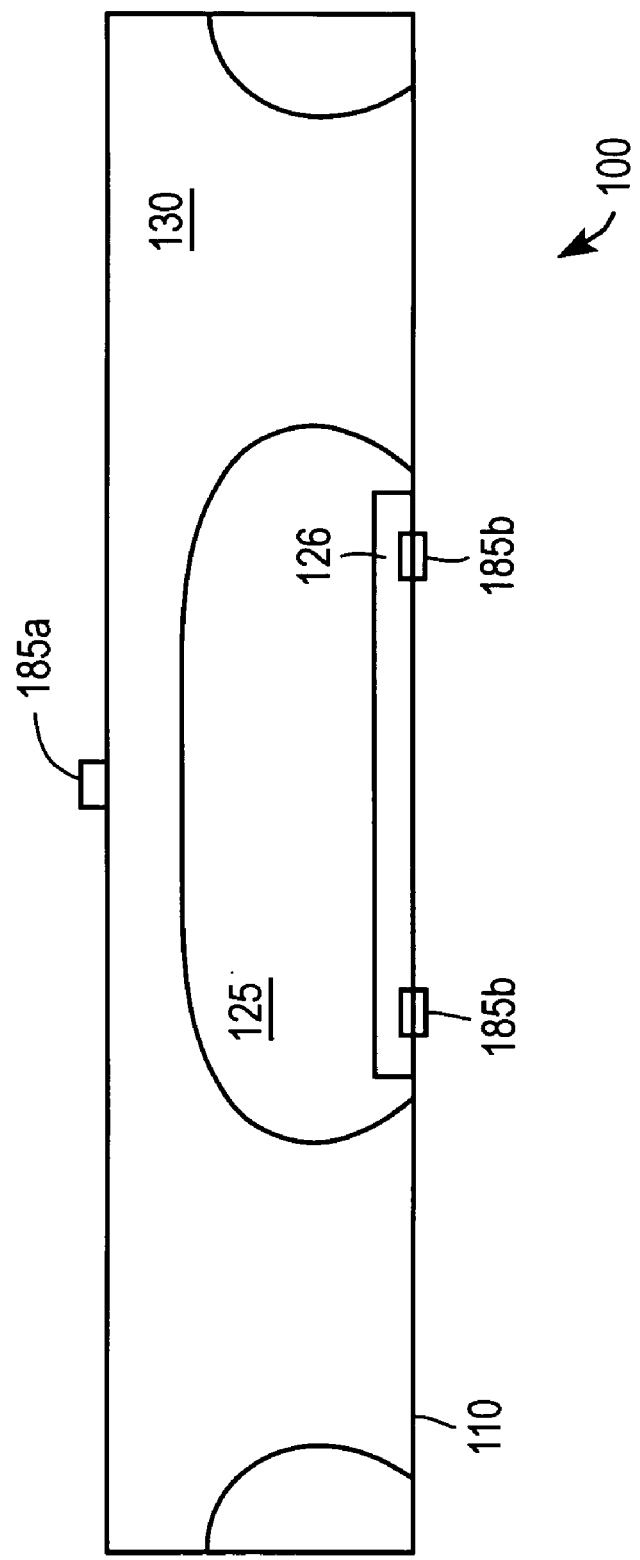
FIGS. 5A and 5B are side and bottom views, respectively, of an APD having a single bias contact coupled to the top surface of the APD, and four bias contacts disposed in bottom surface of the APD in the n-well.
Figure 5B:
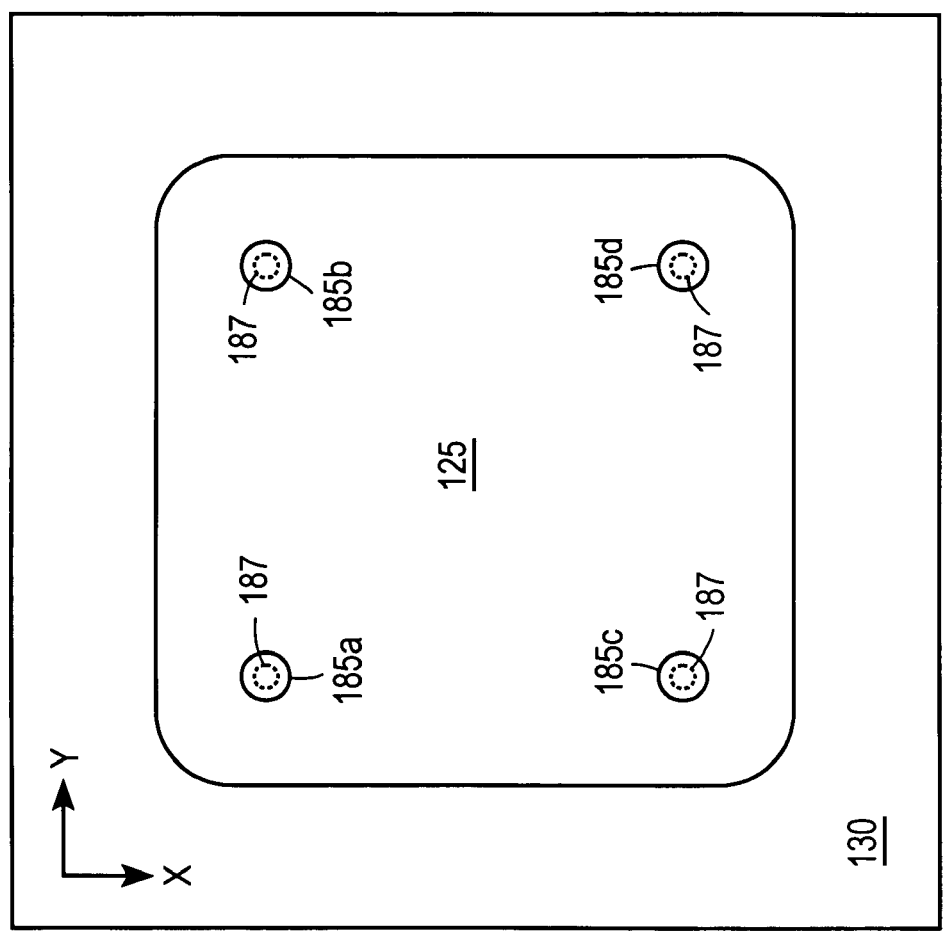

According to one embodiment, the location (x-y location) on APD 100 at which photons and/or a particle are incident may be determined to provide positional detection information. FIGS. 5A and 5B are side and bottom views, respectively of APD 100 having a single bias contact 185*a* coupled to the top surface of the APD and four bias contacts 185*b* disposed in bottom surface 110 in the n-well. Bias contact 185*a* may be coupled to the top surface via an extended conductive layer, such as a p+ layer (not shown). Bias contacts 185*b* may be formed in an n+ mesa that has been formed in the bottom surface of the n-well.

An area 187 on top of each bias contact 185 may be coated with a conductive material, such as gold. While the APD is shown as having four bias contacts, the APD may have more or fewer contacts. Based on the amount of avalanche charge associated with a detected optical or nuclear event, for example, and detected by each bias contact 185*b*, the approximate location on the APD at which the detected event occurs may be determined. Detection circuitry coupled to the bias contacts configured to determine the location of the detected "event" (i.e., detected photon or detected particle) is described in detail below.

According to one embodiment, APD 100 shown in FIGS. 5A and 5B may be included in an array of APDs wherein a single bias contact is coupled to the top surface of the array, and each APD in the array includes four bias contacts formed in an n+ mesa in the bottom surface of the APD.

Figure 6:
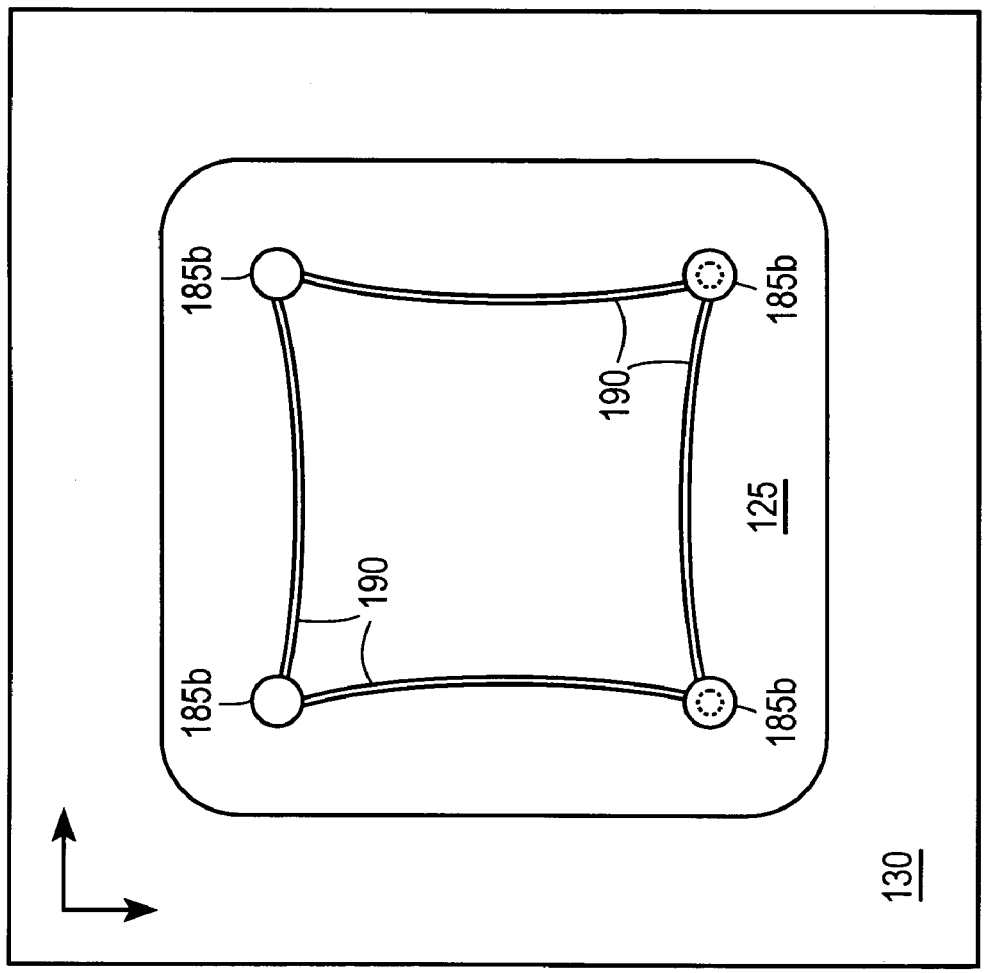
FIG. 6 is a bottom view of the APD and shows a set of termination lines that is coupled to the bias contacts.

According to one embodiment, the bias contacts 185*b* are coupled via a set of termination lines 190 as shown in FIG. 6. The termination lines may be conductive and may be formed at least partially in etched mesas of n+ doped silicon that are formed in bottom surface of the n-well. The termination lines are configured to correct pincushion distortion in positional images of detected photons and/or particles. According to one embodiment, the termination lines are arced and have a radius of curvature "a" such that a=r/R, wherein r is the sheet resistivity in ohm-cm and R is the total resistance of a given termination line between two bias contacts. According to a specific embodiment, the radius of curvature of the termination lines is approximately two inches, and the width of the termination lines is approximately 5 mils.

Figure 8:
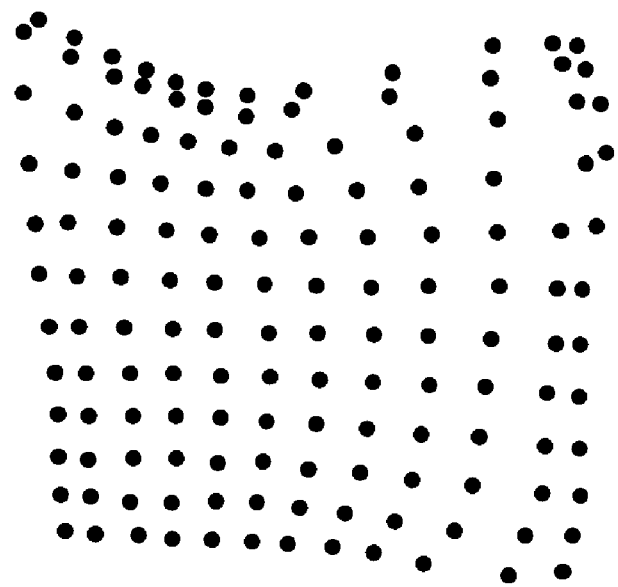
FIG. 8 is a simplified schematic of avalanched electrons generated from detected photons and/or particles, accelerated through voltages near breakdown, and collected by positive biased contacts coupled to termination lines as shown in FIG. 6.
Figure 7:
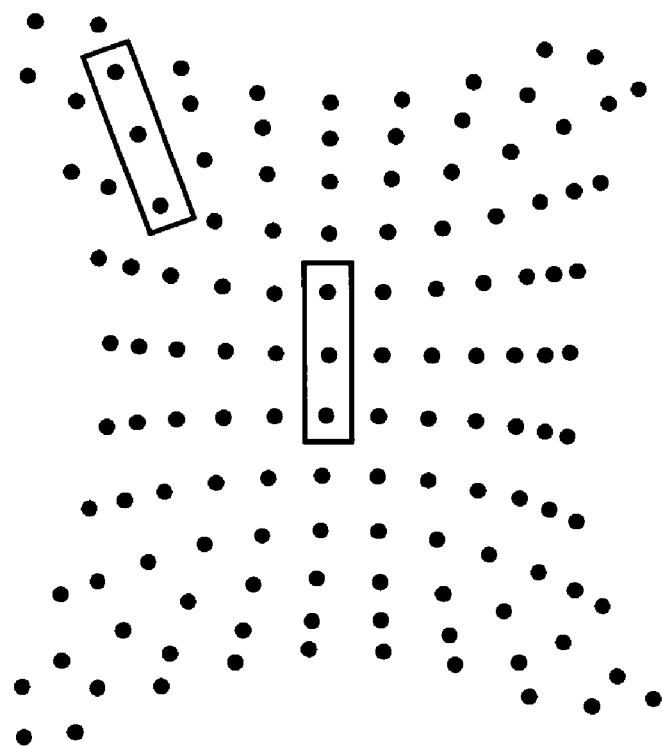
FIG. 7 is a simplified schematic of avalanched electrons generated from detected photons and/or particles, accelerated through voltages near breakdown, and collected by the bias contacts, which are substantially in the configuration shown in FIGS. 5A and 5B.

FIG. 7 is a simplified schematic of detected photons and/or particles generated from voltages collected by the bias contacts 185, which are substantially in the configuration shown in FIGS. 5A and 5B. Simplified schematic 195 includes pincushion distortion from square, for example, at the corners of the image. FIG. 8 is a simplified schematic of detected photons and/or particles generated from voltages collected by bias contacts 185 that are coupled by termination lines 190, which are substantially in the configuration shown in FIG. 6. Note that the pincushion distortion is substantially corrected by the termination lines. Pincushion distortion may also be corrected via a calculation as will be well understood by those of skill in the art.

According to one embodiment, bias contacts 185 are disposed at select distances from sidewalls 140*a* and 140*b* so that arcing of the high voltage from the bulk material to the bias contacts will substantially not occur. According to a specific embodiment, the distance between the biased contacts and the sidewalls is at least 30 mils. The locations of the bias contacts can be optimized based on the specific application for which the detector is to be used.

Figure 9A:
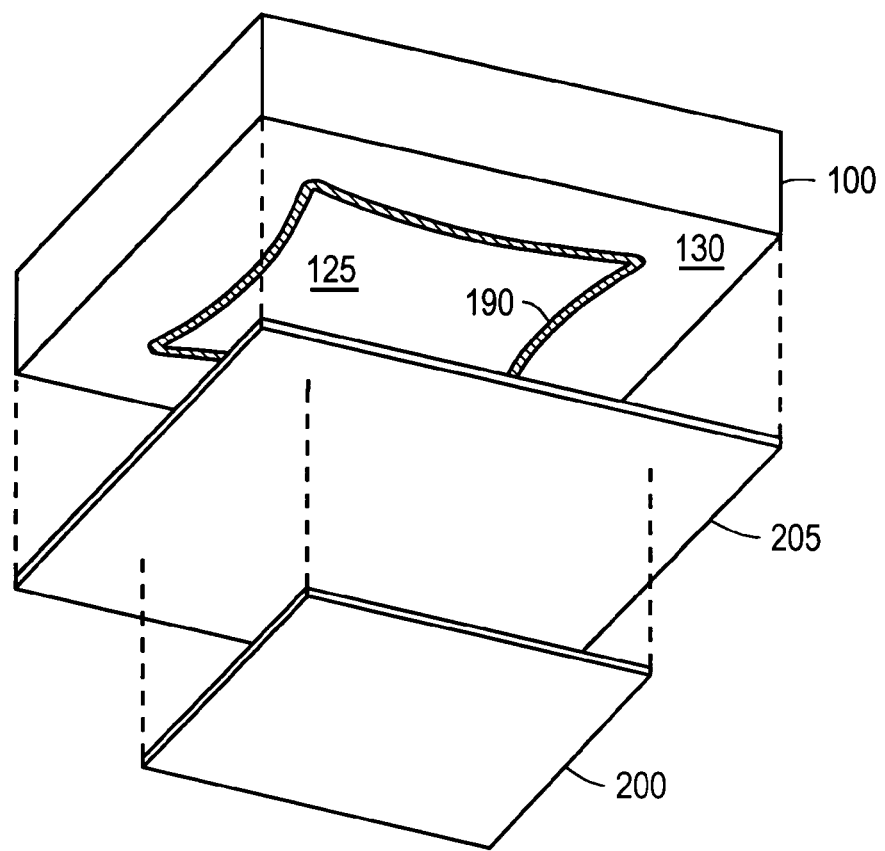
FIG. 9A is a bottom view of an APD according to another embodiment of the present invention.
Figure 9B:
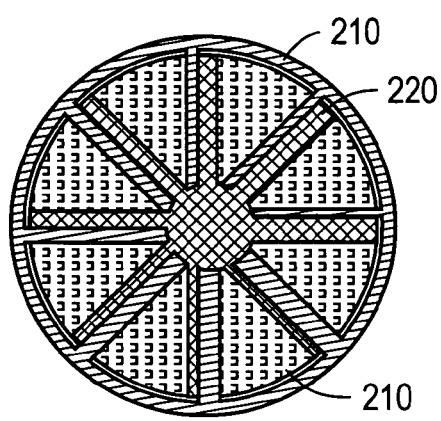
FIGS. 9B and 9C are, respectively, a bottom view and a cross-sectional view of a set of conductors.
Figure 9C:
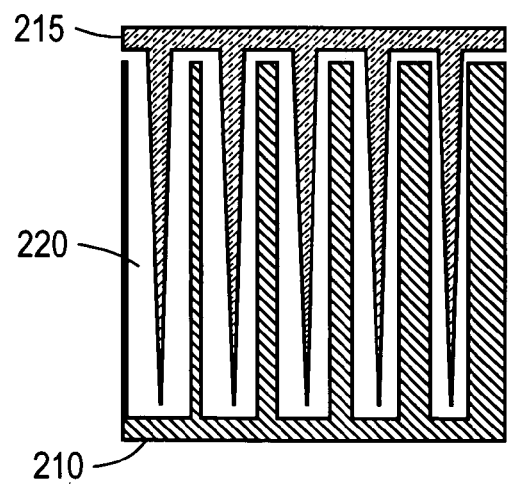

FIG. 9A is a bottom view of an APD 100′ according to another embodiment of the present invention. The same numeral scheme used to identify elements of APD 100 is used to identify the same or similar elements of APD 100′. APD 100′ includes a patterned-readout-contact structure 200 that is separated from the p-region 130 by an insulating dielectric layer 205. The patterned-readout-contact structure is capacitively coupled to the n-region. Similar to APD 100 described above, a set of termination lines 190 may be formed in the bottom surface of the n-well and may be coupled to the bias contacts 185 to correct for pincushion distortion. The patterned-readout-structure 200 may include sets of conductors (e.g., capacitive elements, inductive elements, etc.) 210, 215, and 220 as shown in FIGS. 9B and 9C. FIG. 9B is a bottom view of the sets of conductors 210, 215, and 220, and FIG. 9C is a cross-sectional view of these conductors. According to one embodiment, the sets of conductors are electrically isolated from one another. Further, the sets of conductors are insulated from voltage applied to the p-region and the n-well via dielectric layer 205. Dielectric layer 205 inhibits arcing between the n-well and the sets of conductors. The sets of conductors may include arrays of individual contacts configured to capacitively detect or inductively detect charge accumulation on the p-region associated with avalanche multiplication, such that the individual contacts provide positional detection information for detected photons and/or particles.

Figure 10:
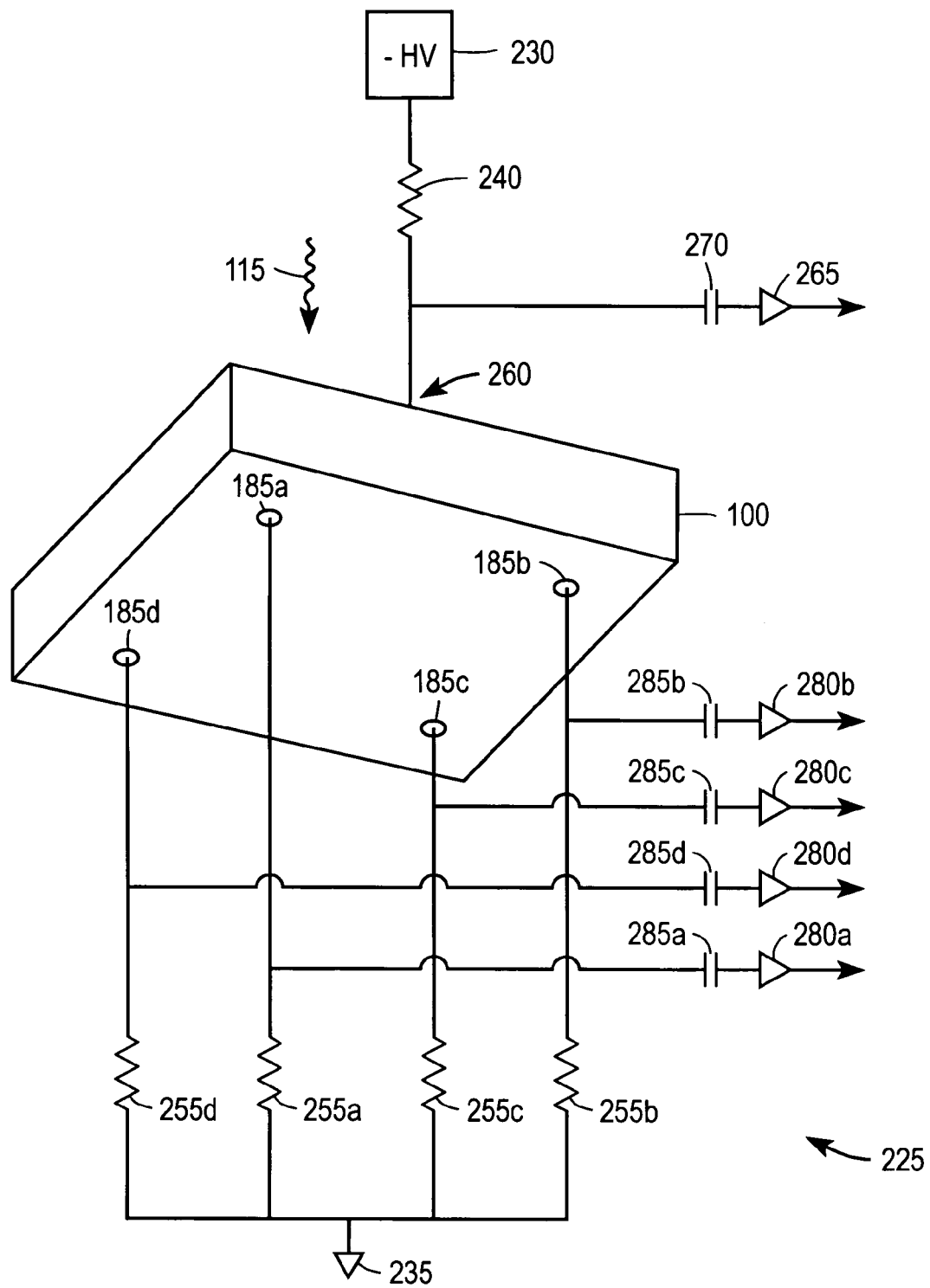
FIG. 10 is a perspective view of the APD coupled to a set of detection circuitry that is configured for detecting the location (x-y location) on the APD at which a detection event occurs.

FIG. 10 is a perspective view of APD 100 coupled to a set of detection circuitry 225 that is configured for detecting the location (x-y location) on the position sensitive APD at which a detection event occurs. While detection circuitry 225 is shown in FIG. 10 coupled to a single APD, similar detection circuitry may be coupled to a plurality of APDs formed in an array. The detection circuitry includes a high-voltage power supply 230 and a ground 235 across which the APD is reverse biased. Negative high voltage is applied to the p-region via a bias resistor 240, and the n-well is coupled to ground 235 or a positive voltage. The high voltage signal is applied to the p-region via a bias resistor 250. The four bias contacts 185*a*-185*d* are respectively coupled to the n-well via bias resistors 255*a*-255*d*. Signals from the p-region contact 260 are transferred to a charge sensitive preamplifier 265 through a capacitor element 270. Signals from the charge sensitive preamplifier 265 are transferred to a fast amplifier and a discriminator (not shown but well known in the art) to provide a timing pulse to trigger pulse height digitization and/or for coincidence determination. This same signal from the charge sensitive preamplifier can also be processed by a slower pulse-shaping amplifier (not shown but also well known in the art) to provide a total energy measurement for each detected event. The signals from the bias contacts 185a-185d are respectively transferred to charge sensitive preamplifiers 280a-280d through capacitor elements 285a-285d. The signal generated by charge sensitive preamplifiers 280a-280d may be processed by relatively slower amplifiers (not shown but also well known in the art). Signals from the four bias contacts may be processed by relatively slow pulse shaping amplifiers, and may be further processed by an A/D converter disposed in a computer to digitize the pulse heights of the detected event. A computer program operating on the computer may then calculate an x-y location for a detected event from the digitized pulse heights. The total energy for the detected event can also be calculated from the sum of the individual pulse heights.

The following description provides one example of a method for converting signals from a position sensitive APD into Cartesian or polar coordinates. For the bias contact schemes described above and shown in FIGS. 5A and 5B, the x and y Cartesian coordinates of detected events may be determined from the equations:

$$x=((A+B)-(C+D))/(A+B+C+D), \text{ and}$$

$$y=((A+C)-(B+D))/(A+B+C+D),$$

wherein A, B, C, and D are the peak pulse heights of signals generated by the pulse shaping amplifiers (not shown but well known in the art) coupled respectively to charge sensitive amplifiers 280a-280d. For the contact scheme described above and shown in FIGS. 9B and 9C the r and θ polar coordinate may be determined from the equations:

$$r-r_0=2A/(A+B+C), \text{ and}$$

$$\theta=2\pi B/(B+C); \text{ and}$$

the Cartesian coordinates may be calculated from the equations:

$$x=2A/(A+B+C), \text{ and}$$

$$y=2B/(A+B+C).$$

A further understanding of the apparatus and the methods for determining the position of a detected event may be obtained via review of U.S. Pat. No. 6,781,133, titled "Position Sensitive Solid State Detector With Internal Gain," of Karplus et al., assigned to the assignee of the presently described invention, which is incorporated by reference herein in its entirety for all purposes.

Figure 11:
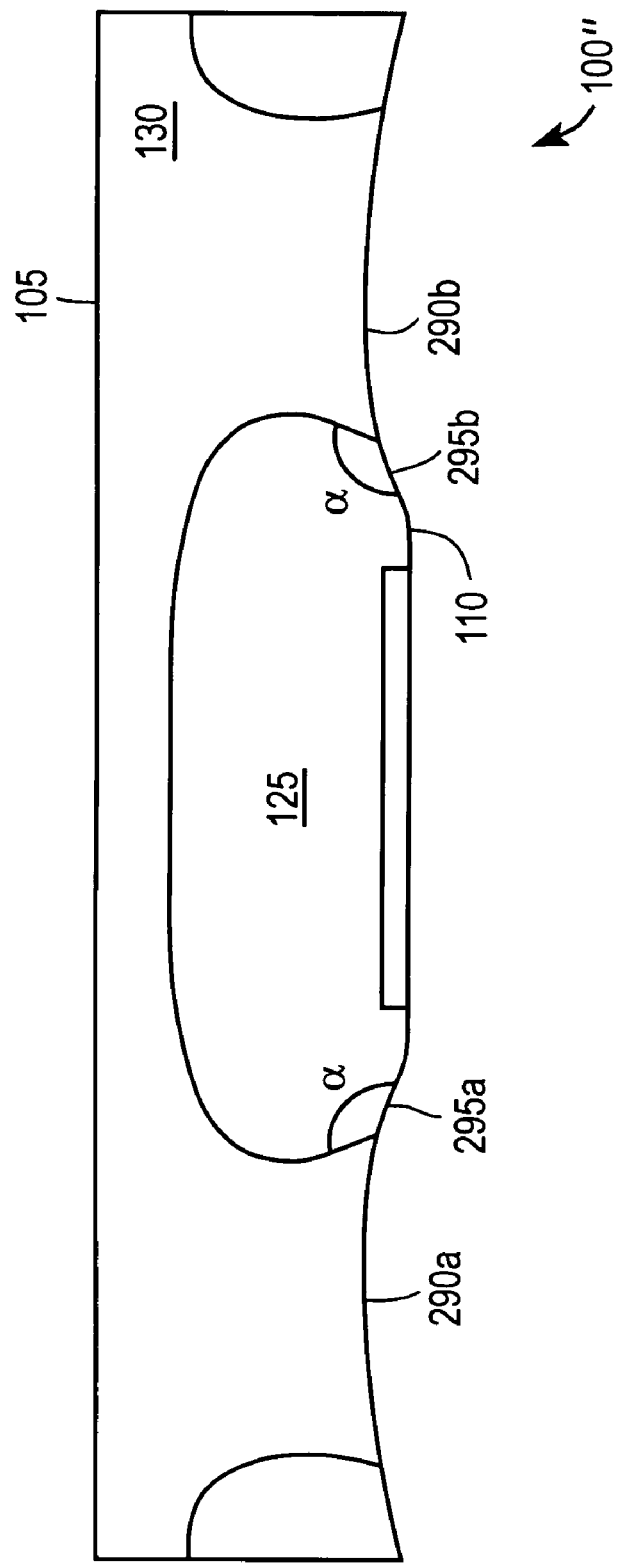
FIG. 11 is a cross-sectional view of an APD according to another embodiment of the present invention.

FIG. 11 is a cross-sectional view of an APD 100" according to another embodiment of the present invention. APD 100" differs from APD 100 described above in that portions 290a and 290b of the p-region, which form a portion of the bottom surface, are recessed. Side portion 295a and 295b of the n-well may also be recessed, such that portion 290a and portion 295a form a single recession in the bottom surface the APD, and portion 290b and portion 295b form another single recession in the bottom surface the APD. The obtuse angle α at which the p-n junction meets the bottom surface of APD 100" may be less than or greater than the obtuse angle α of APD 100 depending on the profile of the recessions.

Figure 12A:
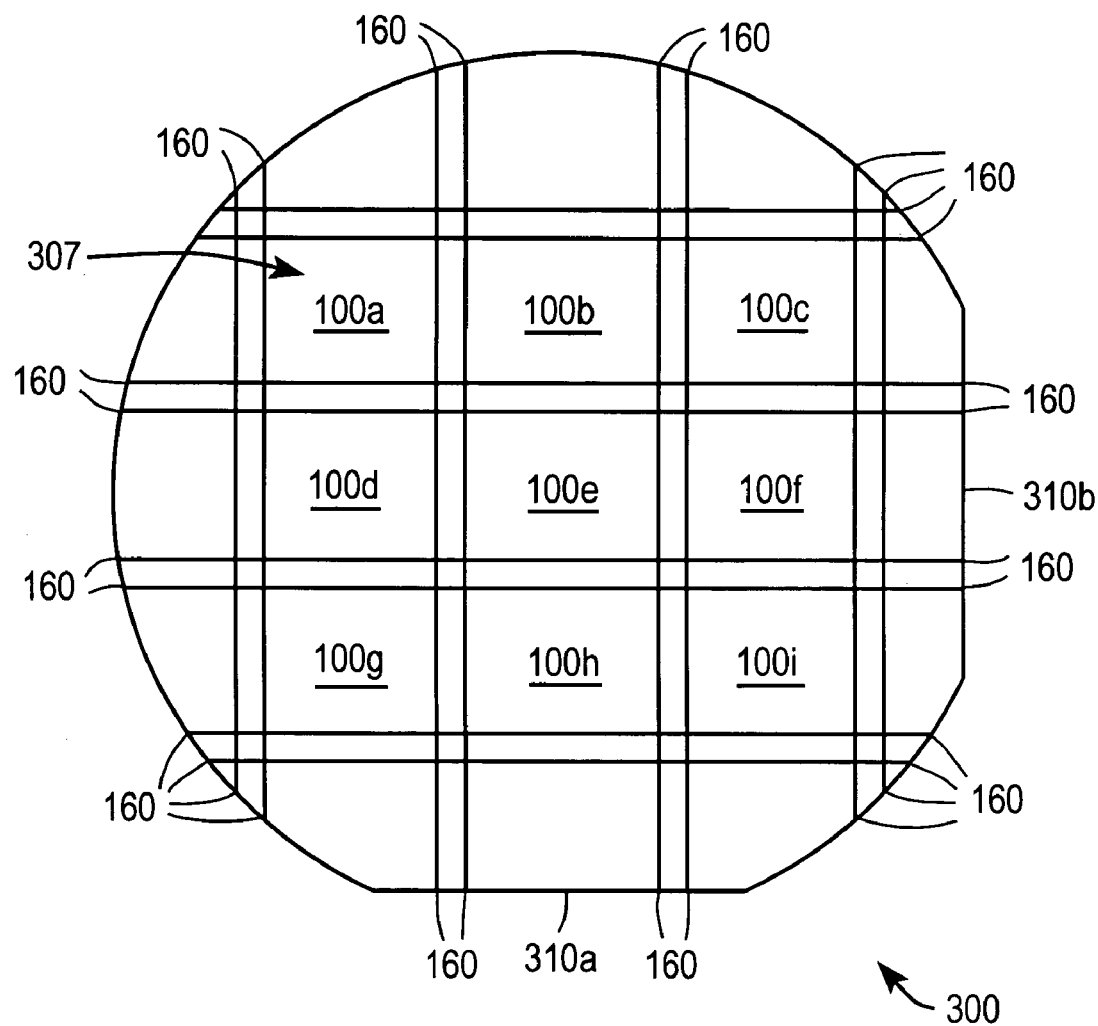
FIGS. 12A and 12B are, respectively, a simplified top view and a cross-sectional view of a semiconductor wafer from which the APD may be fabricated.
Figure 12B:
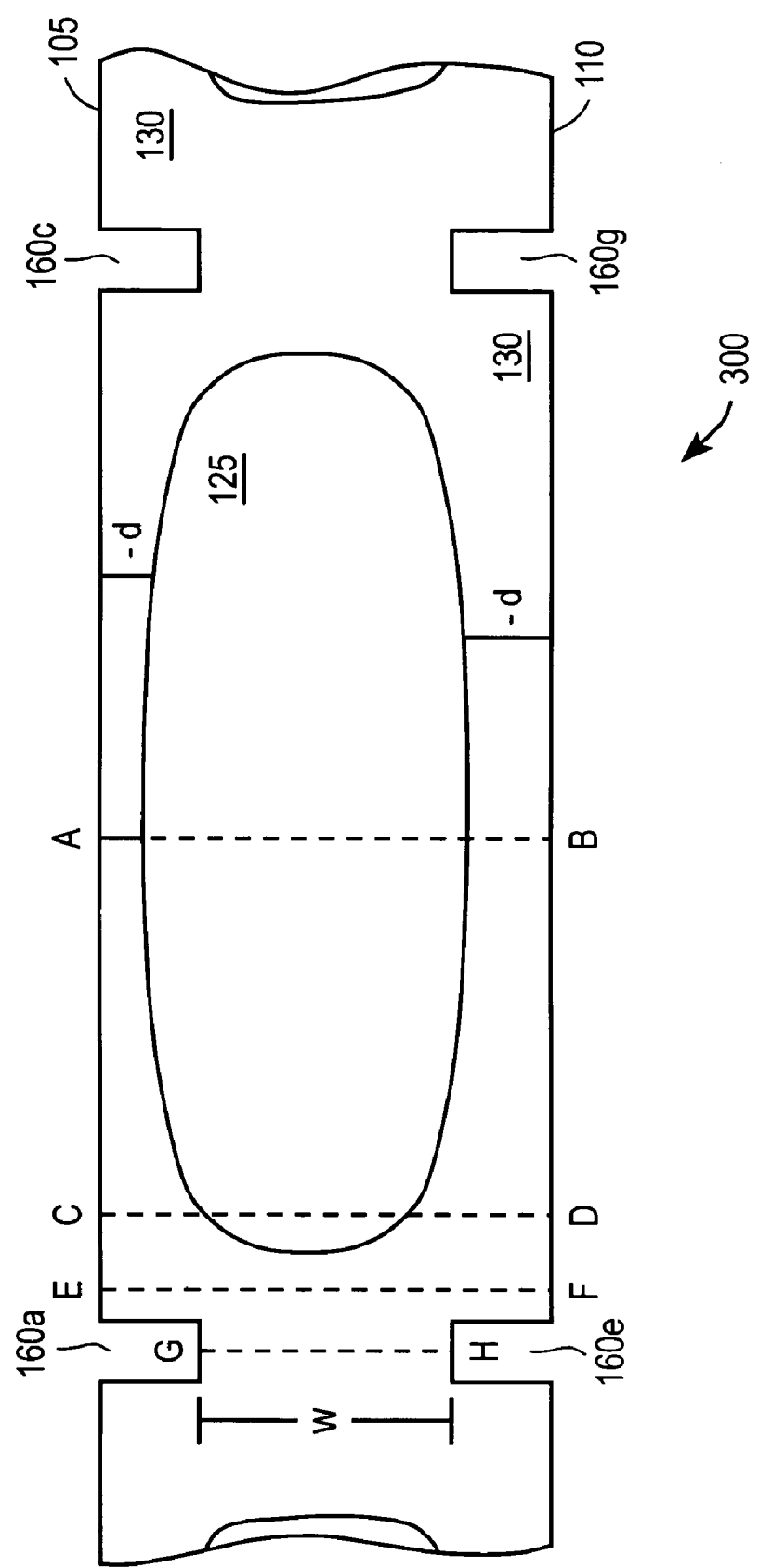
Figure 13:
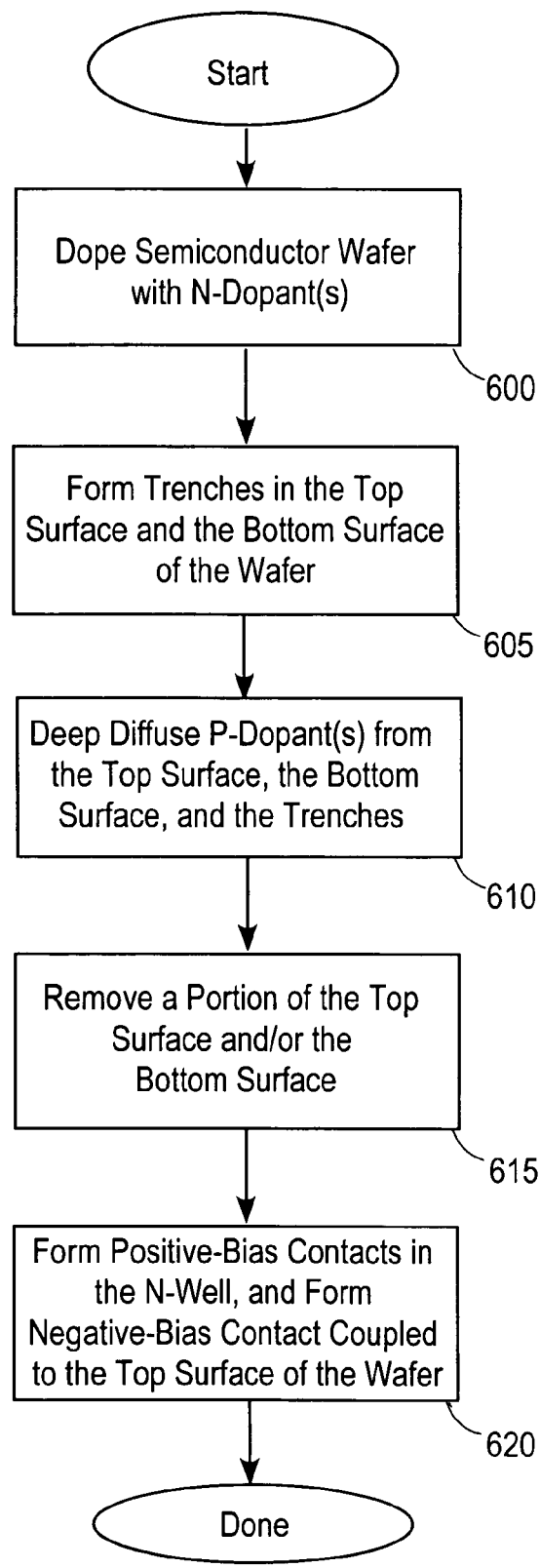
FIG. 13 is a high-level flow chart that includes steps for fabricating the APD.

FIG. 12A is a simplified top view of a semiconductor wafer 300 from which APDs described herein may be fabricated. FIG. 12B is a simplified cross-sectional view of a portion of wafer 300 from which a specific APD (e.g., APD 100a) may be formed. Wafer 300, as shown, is configured to provide nine relatively large area APDs 100a-100i. A method for fabricating wafer 300 and for fabricating an APD therefrom is presently described in detail. FIGS. 12A and 12B are referred to in combination with FIG. 13, which is a high-level flow chart that includes steps for fabricating wafer 300 and an APD therefrom. It should be understood that the described fabrication method is exemplary and that various steps in the described method may be substituted with various equivalent steps and/or various steps may be combined. In an initial step 600, semiconductor wafer 300 (e.g., a silicon wafer) is doped with an n-dopant(s). The wafer may be n-doped via a neutron transmutation doping process.

Subsequent to doping the wafer with an n-dopant(s), a plurality of trenches 160 is formed in the wafer, step 605. The trenches are formed in the top surface and the bottom surface of the wafer as shown in FIG. 12B. Each trench formed in the top surface is formed substantially opposite to a corresponding trench formed in the bottom surface of the wafer. For example, in the cross-sectional view of the wafer shown in FIG. 12B, trench 160a is shown as being disposed substantially opposite to a corresponding trench 160e, and trench 160c is shown as being substantially opposite to a corresponding trench 160g. Corresponding, opposite trenches are substantially parallel to one another; for example, trenches 160a and 160e are substantially parallel, and trenches 160c and 160g are substantially parallel (FIG. 12B).

Each APD to be formed is associated with eight trenches. Specifically, each APD to be formed is associated with four trenches formed in the top surface and with four trenches formed in the bottom surface. For example, APD 100a (to be formed) is associated with four trenches 160a-160d formed in the top surface of the wafer, and with four trenches (two trenched 160e and 160g formed in the bottom surface are shown in FIG. 12B) formed in the bottom surface. The four trenches formed on the top surface, and associated with a given APD, define a "closed" region 307 in a central portion of the top surface of the given APD to be formed. Similarly, the four trenches formed on the bottom surface and associated with the given APD define another "closed" region of the given APD to be formed.

According to one embodiment, the wafer may be cut (or otherwise processed) to form two perpendicular sides 310a and 310b. Numerous wafer-cutting techniques, such as sawing, laser cutting, and the like, are well know in the art and are not described in detail herein. The perpendicular sides may be used as reference guides for forming trenches 160 so that corresponding, opposed trenches are substantially parallel, and so that the vertical trenches and horizontal trenches are substantially perpendicular. Vertical and horizontal refer to the plane of the drawing page, which corresponds to the plane of the wafer.

Trenches 160 may be formed by a variety of methods. For example, the trenches may by cut and/or etched (e.g., wet and/or dry chemical etch) into the wafer. According to one embodiment, the trenches are cut into the wafer using a grinding wheel, a wafer dicing saw or the like, wherein the grinding wheel, wafer dicing saw or the like may having substantially "square edges" rendering trenches having substantially rectangular profiles. Alternatively, the trenches may be formed by laser ablation techniques. While trenches 160 are shown as rectangular in FIG. 12B, the trenches may have other shapes, such as v-shaped, rounded, etc. V-shaped trenches may have a variety of angles depending on the particular detection application desired. For example, the walls of v-shaped trenches may be 27°, 45°, etc. from vertical, or these trenches may have interior angles that are 27°, 45°, etc. V-shaped trenches may be formed using a v-shaped cutting tool.

Trenches 160 may have a variety of depths, and trenches formed in opposite surfaces of the wafer and may have different depths. The depths of the trenches, according to a specific embodiment, are described below.

At step 610, a "deep" diffusion of "fast" diffusing p-dopant(s), such as aluminum, boron, and/or gallium, is performed on the wafer. The p-dopant(s) is diffused into wafer 300 from both the top surface and the bottom surface. The p-dopant(s) may be diffused into the wafer in a sealed quartz ampoule using techniques known in the art (such techniques are commonly used to manufacture high voltage thyristors). A typical diffusion may expose multiple wafers at more than 1200C, for example, for 150 hours or more. Typically 50 or more wafers are deep diffused at a given time. Deep diffusion provides the p-region cross section of wafer 300 shown in FIG. 12B. Specifically, the p-region of the wafer (which is to become the p-region of the APD to be formed) surrounds the n-well of the wafer (which is to become the n-well of the APD to be formed). More specifically, the p-dopant(s) diffuse deeper into the wafer adjacent to and below the trenches than in the regions between the trenches.

The depth of the deep diffusion is defined as the depth "d" from the top surface and/or the bottom surface to the n-type portion of the wafer. According to one embodiment, the width "w" between the bottoms of opposite trenches is less than or substantially equal to twice the depth d of the deep diffusion. According to one embodiment, the width w is approximately 160 micrometers to approximately 350 micrometers. According to a specific embodiment, the width w is approximately 290 micrometers. According to another specific embodiment, the width w is greater than or equal to the height of APD 100 described above. According to yet another specific embodiment, w is less than h, and some remnant of the trenches will remain on one or both of the device surfaces after grinding and etching the top and bottom surfaces. According to one specific embodiment, the depth of the top trenches is about 80 micrometers and the depth of the bottom trenches is about 180 micrometers.

According to a specific embodiment, the deep diffusion of p-dopant(s) provides the densities of the p-dopant(s) shown in the log graphs of the dopant densities in FIGS. 14A-14D. Specifically, the graph in FIG. 14A shows the density of the p-dopant(s) along the line A-B that runs from the top surface to the bottom surface through the p-region and the n-well. The graph in FIG. 14B shows the density of the p-dopant(s) near one side of the n-well. The density of the p-dopant(s) shown in FIG. 14B is similar to the dopant densities shown in FIG. 14A except that at the sides of the n-well, the p-region is wider and the n-well is narrower. The p-region at the sides of the n-well is wider than at central portions of the n-well due to the deep diffusion of p-dopant(s) through the trenches. The graphs in FIGS. 14C and 14D show the density of the p-dopant(s), respectively, along vertical lines E-F and G-H. Along both of these lines, the p-dopant has a first value at the top surface, decreases to a second value in the bulk, and increases to a third value at the bottom surface. The density of the p-dopant(s) (changing from high to low and back to high) is provided by diffusing the p-dopant(s) from both the top surface and the bottom surface of the wafer.

At step 615, a portion of the top surface and/or the bottom surface is removed to form APD 100 (or an array APDs). A portion of the top surface and/or bottom surface may be removed by using one or more of a variety of removal methods, such as grinding, polishing, etching, ablation or the like. Portions removed from the wafer may be less than, equal to, or greater than the depths of the trenches. In general, material is not removed to such an extent that the depletion region (under high voltage) of the APD is reached (except where the interface of the n-well and the p-region intersect the bottom surface).

Excess p-doped material may be removed to reduce noise from charge carriers thermally generated in the p-type silicon. The thickness of material removed from the bottom of the wafer is generally greater than the thickness of material removed from the top of the wafer. However, the amount of material removed from the bottom of the wafer is such that the bottom surface does not reach the depletion region of the n-well if the APD is reverse biased to the breakdown voltage.

Figure 15:
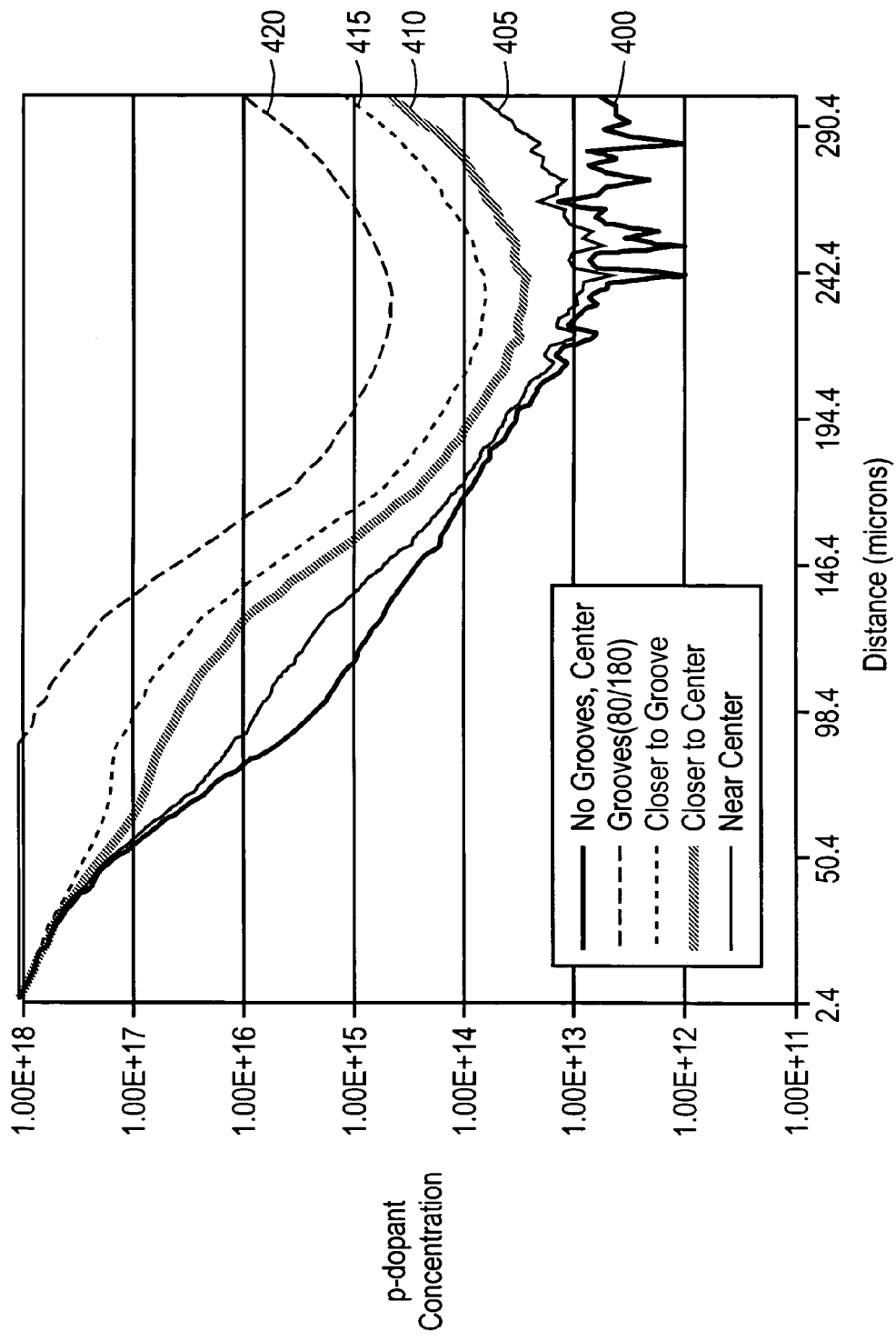
FIG. 15 is a graph of the p-dopant(s) concentration in the APD according to a specific embodiment of the present invention.
Figure 16:
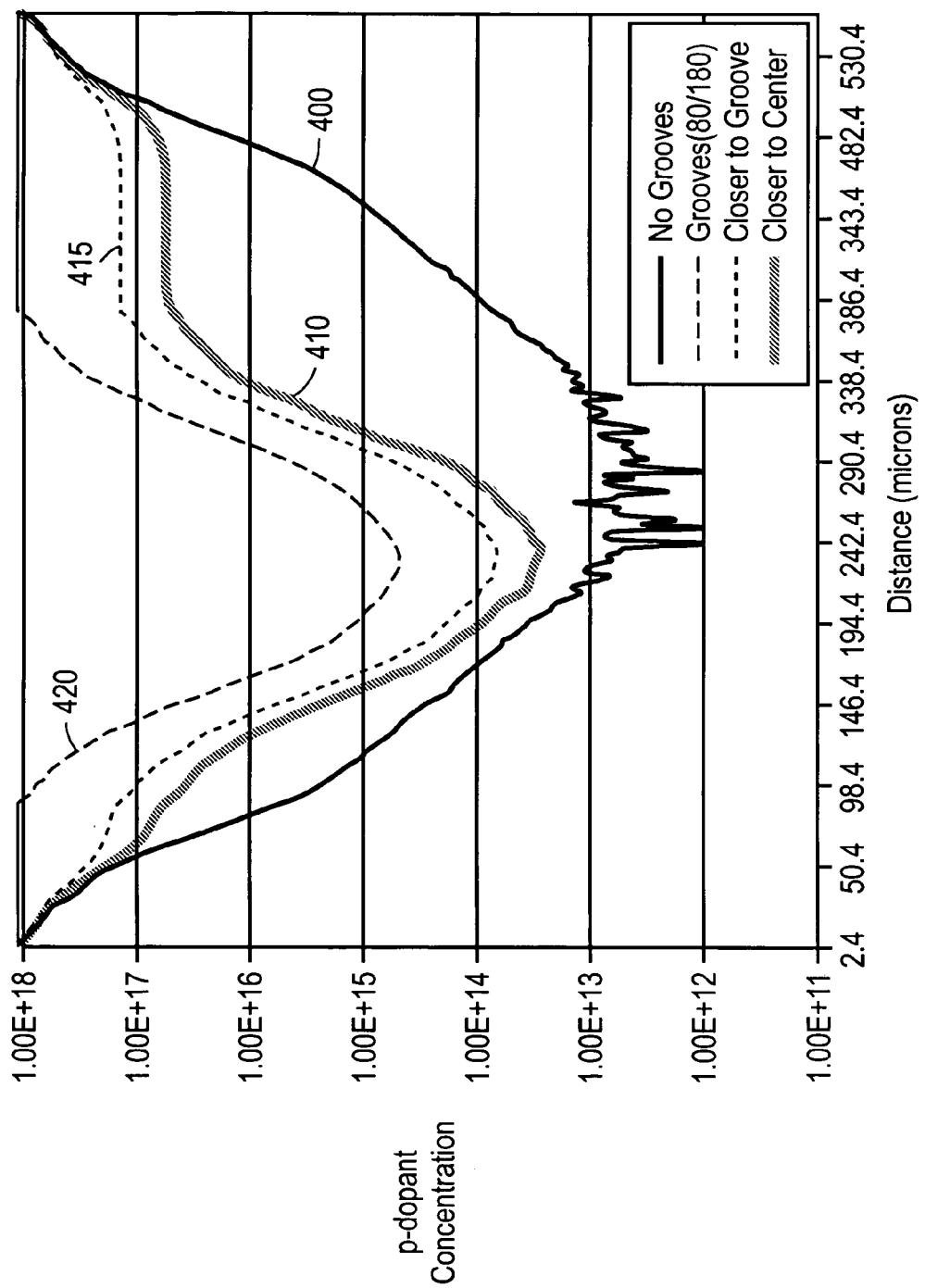
FIG. 16 is a graph of the p-dopant(s) concentration in the wafer according to a specific embodiment of the present invention.

According to one embodiment, the p-n junction occurs where the p-dopant concentration is about $10^{14}$ particles per cubic centimeter, and the material is n-type where the p-dopant concentration is less than $10^{14}$ particles per cubic centimeter. FIG. 15 is a graph of the concentration of the p-dopant(s) in APD 100 according to a specific embodiment of the present invention. The bottom axis of the graph represents the distance from the top surface of the finished APD as shown in FIG. 1. That is, the distance 2.4 microns at the right side of the graph represents a depth of 2.4 microns below the top surface, and the distance 290.4 microns represents a depth of 290.4 microns below the top surface (e.g., the bottom surface). The bottom line on the graph identified by reference numeral 400 represents the p-dopant concentration along a vertical line that is approximately centered between trenches 160a and 160c, such as line C-D in FIG. 2A. The lines on the graph identified by reference numeral 405, 410, and 415 indicate increasing horizontal distances from line C-D. The line on the graph identified by reference numeral 420 lies between the bottoms of oppositely disposed trenches, such as near line A-B in FIG. 2A. According to this specific embodiment, portions of the wafer in which the p-dopant concentration is below $10^{14}$ particle per cubic centimeter are portions of the n-well, and portions of the wafer in which the p-dopant concentration is at or above $10^{14}$ particles per cubic centimeter are portions of the p-region. FIG. 16 is a graph of the p-dopant concentration in (in process) wafer 300 as shown in FIGS. 12A and 12B. The same reference numerals are used in FIGS. 15 and 16 and the lines identified by the reference numerals represent the same wafer positions.

At step 620, the bias contacts (including bias contact in the top surface and the bottom surface) may be formed. Subsequently, The APD may also be passivated, for example, with a polyamide layer, a silicon dioxide layer or the like. Passivation material applied to the top surface and/or the bottom surface provides a layer having high dielectric breakdown strength where the electric fields emerging from the APD are relatively high. Subsequent to passivation, the APDs may be diced, coupled to detection circuitry 225, and packaged (e.g., packaged using a flip chip method).

According to one embodiment, alumina substrates (not shown), with appropriate feed-through connectors, are joined to the APD using a combination of mutually compatible silver filled and underfill epoxies. The use of such substrates are well know in the art and will not be described in further detail except to note that silver epoxy bumps may be configured to make electrical connection between the APD contacts and pins on the alumina substrate. The resulting space between the APD and the alumina substrate may be filled with a non-conducting, low viscosity underfill material such as cyanate ester or epoxy to provide mechanical support and environmental protection to the APD. Two electrical connections for the n-well and the p-region of the APD may be provided on the backside of the alumina substrate in the form of pins. The p-region connection may be routed via the device edge to the backside of the alumina substrate.

For "low" temperature (e.g., cooling by liquid nitrogen, approximately 77°K) APD applications, aluminum nitride substrates may be joined (as described above) to the APD (e.g., instead of alumina substrates). The thermal expansion coefficient of aluminum nitride is substantially similar to that of silicon, and the thermal conductivity of aluminum nitride is higher than alumina. Experimental results demonstrate that a 45 cm$^2$ APD packaged joined to aluminum nitride can be temperature cycled between room temperature and 77°K more than a twelve times without performance degradation. Additional results indicate that an APD joined to aluminum nitride substrates can sustain operability across temperature cycling of 77°K to 473°K.

Figure 17:
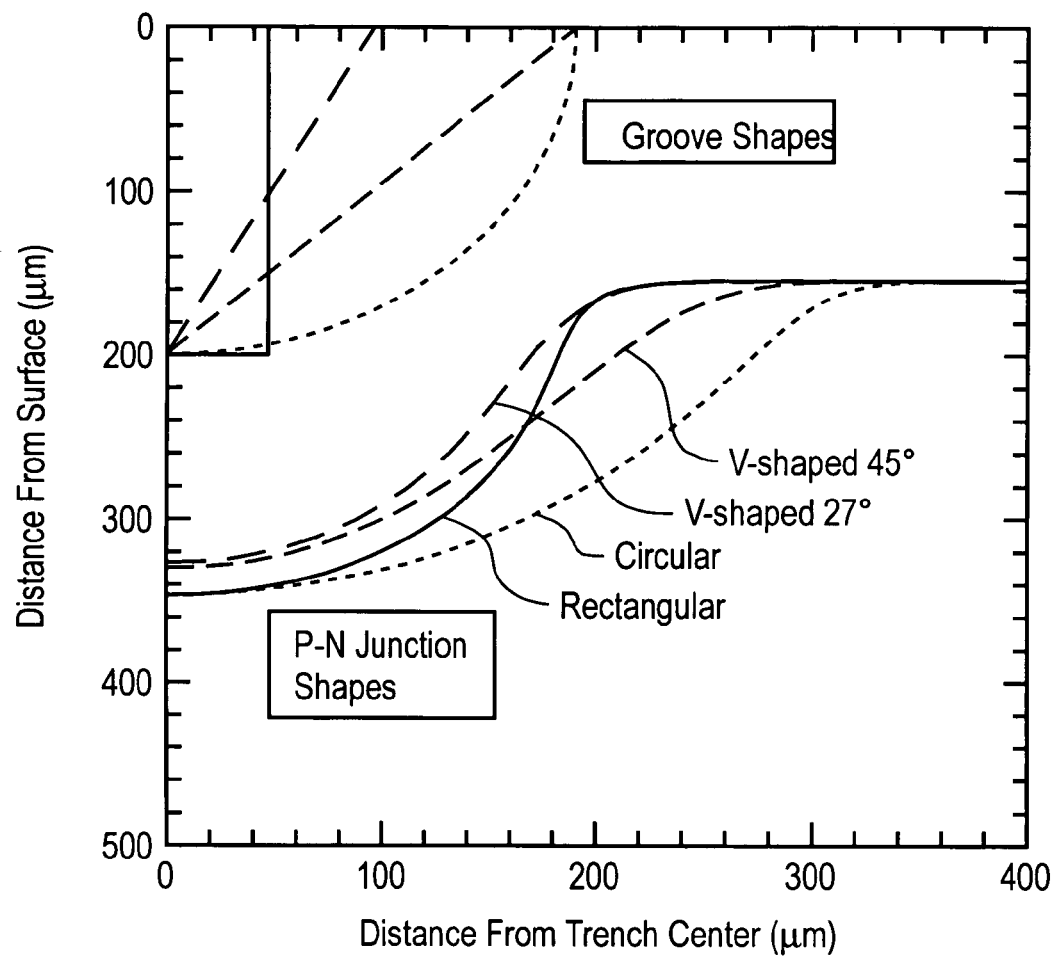
FIG. 17 is a graph that shows various shapes of the p-n junction in the center and near a side of the n-well based on the shape of the trenches formed in the top surface and bottom surface.

FIG. 17 is a graph that shows various shapes of the p-n junction based on the shape of the trenches formed in the top surface and bottom surface. The vertical axis of the graph represents the distance from the top surface. Specifically, zero micrometers represents the top surface, and 500 micrometers represents the distance from the top surface in the APD. The horizontal axis represents the distance in micrometers from the center of a trench toward the center of the n-well. Four p-n junction shapes are shown for four trench shapes. The four trench shapes include rectangular, circular, V-shaped with a 45° interior angle, and V-shaped with a 27° interior angle. According to one embodiment, trench shapes may be chosen based on the particular APD application via selection of trench shapes to be formed in a wafer 300. According to some embodiments, the trenches in the top surface and the bottom surface of wafer 300 may have different shapes to effect different shaped p-n junctions.

It is to be understood that the examples and embodiments described above are for illustrative purposes only and that various modifications or changes in light thereof will be suggested to persons skilled in the art and are to be included within the spirit and purview of this application and scope of the appended claims. For example, while detection circuitry 225 has been described as being configured to provide position sensitive detection for a single APD, the detection circuitry may be coupled to an array of APDs, such that a given APD in the array may be determined to have detected an event as compared to a position of a detected event in a single APD, or, the position of detection of an event may be determined within each APD well in an array for the whole array. Further, while the trenches formed in the top surface and bottom surface of the wafer are described and shown as forming a substantially orthogonal pattern (i.e., a substantially square pattern around each APDs), the trenches may formed in nearly any closed shape around a given APD, such as a capricious shape, a circular shape, a triangular shape, a pentagonal shape, a hexagonal shape, etc. Therefore, the above description should not be understood as limiting the scope of the invention as defined by the claims.

What is claimed is:

1. A method of forming a semiconductor-detection device configured to detect photons and/or particles and provide internal gain from detected photons and/or a detected particle, the method comprising:
   forming a plurality of bottom trenches in a bottom surface of an n-doped semiconductor wafer,
   forming a second plurality of top trenches in a top surface of the semiconductor wafer, wherein the bottom surface and the top surface are opposed surfaces, and each of the bottom trenches is substantially parallel to and substantially juxtaposed to an associated one of the top trenches;
   doping the semiconductor wafer with at least one p-type dopant to form a p-region that defines at least one n-well within the p-region, wherein a p-n junction is formed substantially at an interface of the n-well and the p-region; and
   removing a portion of the bottom surface to form a remaining-bottom surface, wherein a portion of the n-well forms a portion of the remaining-bottom surface.

2. The method of claim 1, further comprising removing a portion of the top surface to form a remaining-top surface, wherein the p-region forms the remaining-top surface.

3. The method of claim 2, wherein the step of removing the portion of the bottom surface includes a step of mechanically removing material from the bottom surface and a step of etching material from the bottom surface, and wherein the step of removing the portion of the top surface includes a step of mechanically removing material from the top surface, and a step of etching material from the top surface.

4. The method of claim 2, wherein the steps of removing the portion of the bottom surface and removing the portion of the top surface each includes grinding and then polishing the respective surfaces.

5. The method of claim 2, wherein the distance between the remaining-bottom surface and the remaining-top surface is approximately from 30 micrometers to approximately 2000 micrometers.

6. The method of claim 1, wherein the p-type dopant includes gallium, boron, and/or aluminum.

7. The method of claim 1, further comprising doping the semiconductor wafer with the n-dopant via neutron transmutation.

8. The method of claim 1, wherein the p-n junction meets the bottom surface at an obtuse angle on the n-well side of the p-n junction.

9. The method of claim 1, wherein the bottom trenches and the top trenches are respectively formed in substantially orthogonal patterns.

10. The method of claim 1, wherein the bottom trenches and the top trenches each forms a polygonal shape.

11. The method of claim 1, wherein the bottom trenches and the top trenches have substantially rectangular cross-sections.

12. The method of claim 1, wherein the doping step includes deep doping.

13. A photodiode comprising:
    an n-well extending inward from a bottom surface; and
    a p-region disposed partially around the n-well such that a p-n junction is disposed substantially at an interface between the n-well and the p-region, wherein:
    the p-region forms a top surface that is opposite to the bottom surface,
    the p-region and the n-well form the bottom surface, and the p-n junction meets the bottom surface at an obtuse angle on the n-well side of the p-n junction.

14. The photodiode of claim 13, wherein p-dopant in the p-region is deeply diffused.

15. The photodiode of claim 13, wherein n-dopant in the n-well has a substantially homogeneous concentration.

16. The photodiode of claim 13, wherein the n-well includes neutron transmutation doped silicon.

17. The photodiode of claim 13, wherein p-dopant in the p-region includes gallium, boron, and/or aluminum.

18. The photodiode of claim 13, wherein a concentration of p-dopant has a first value at the top surface, decreases to a second value in the bulk of the p-region, and increases from the second value in the bulk to a third value at the bottom surface.

19. The photodiode of claim 13, further comprising means for using charge separation to obtain electrical signals from the device in response to incident radiation, wherein the position of the incident of radiation is calculated using a plurality of the electrical signals.

20. The photodiode of claim 19, further comprising means for calculating the energy of the incident radiation from the electrical signals.

21. The photodiode of claim 19, further comprising means for calculating the time of incidence of the incident radiation from the electrical signals.

22. The photodiode of claim 19, wherein the means for calculating the position of the incident radiation is configured to correct for geometric distortion of position information in the electrical signals.

23. The photodiode of claim 19, wherein the electrical signals are obtained by resistive coupling, a rise time measurement, inductive coupling, and/or capacitive coupling.

24. A photodiode comprising:
an n-well extending inward from a bottom surface; and
a p-region disposed partially around the n-well such that a p-n junction is disposed substantially at an interface between the n-well and the p-region, wherein:
the p-region forms a top surface that is opposite to the bottom surface,
the p-region and the n-well form the bottom surface, and
a concentration of p-dopant in a first portion of the p-region, which is horizontally adjacent to the n-well, has a first value at the top surface, decreases to a second value in the bulk of the p-region, and increases from the second value in the bulk to a third value at the bottom surface.

25. The photodiode of claim 24, wherein the p-n junction meets the bottom surface at an obtuse angle on the n-well side of the p-n junction.

26. The photodiode of claim 24, wherein p-dopant in the p-region is deeply diffused.

27. The photodiode of claim 24, wherein n-dopant in the n-well has a substantially homogeneous concentration.

28. The device of claim 24, wherein the n-well includes neutron transmutation doped silicon.

29. The device of claim 24, wherein p-dopant in the p-region includes gallium, boron, and/or aluminum.

30. An avalanche photodiode array configured to detect incident electromagnetic radiation comprising:
a plurality of n-wells extending inward from a bottom surface; and
a p-region that is disposed partially around each of the n-wells, wherein substantially at an interface region between each n-well and the p-region of a p-n junction is disposed, wherein the p-region forms a top surface, and the p-region and the n-wells form the bottom surface that is opposite to the top surface, wherein the p-n junction meets the bottom surface at an obtuse angle on the n-wells side of the p-n junction.

31. The avalanche photodiode array of claim 30, wherein portions of the bottom surface between the n-wells electrically isolate adjacent ones of the wells along the bottom surface.

32. The avalanche photodiode array of claim 30, wherein each of the n-wells includes n-doped semiconductor that has a substantially homogeneous concentration of n-dopant.

33. The avalanche photodiode array of claim 30, wherein the n-well and the p-region are doped semiconductor regions.

34. The avalanche photodiode array of claim 33, wherein the doped semiconductor regions are doped silicon regions.

35. The avalanche photodiode array of claim 30, wherein a distance between the top surface and the bottom surface is about 30 micrometers to about 2000 micrometers.

36. The avalanche photodiode array of claim 30, further comprising a contact pad in each of the n-type wells, the contact pad comprising n+ doped silicon adjoining the bottom surface.

37. The avalanche photodiode array of claim 30, wherein the n-wells and the p-region are configured to detect electromagnetic radiation that is incident through the top surface.

38. The avalanche photodiode array of claim 30, wherein p-dopant in the p-region includes boron, gallium, and/or aluminum.

39. The avalanche photodiode array of claim 30, wherein the n-wells include neutron transmutation doped silicon.

40. The avalanche photodiode array of claim 30, further comprising means for using charge separation to obtain electrical signals in response to incident radiation, wherein the position of the incident of radiation is calculated using a plurality of the electrical signals.

41. The avalanche photodiode array of claim 40, further comprising means for calculating the energy of the incident radiation from the electrical signals.

42. The avalanche photodiode array of claim 40, further comprising means for calculating the time of incidence of the incident radiation from the electrical signals.

43. The avalanche photodiode array of claim 40, wherein the means for calculating the position of the incident radiation is configured to correct for geometric distortion of position information in the electrical signals.

44. The avalanche photodiode array of claim 40, wherein the electrical signals are obtained by resistive coupling, a rise time measurement, inductive coupling, and/or capacitive coupling.

45. An array of position sensitive APDs configured to detect incident electromagnetic radiation comprising:
a plurality of n-wells extending inward from a bottom surface; and
a p-region that is disposed partially around each of the n-wells, wherein substantially at an interface region between each n-well and the p-region a p-n junction is disposed, wherein the p-region forms a top surface, and the p-region and the n-wells form the bottom surface that is opposite to the top surface, wherein the p-n junction meets the bottom surface at an obtuse angle on the n-wells side of the p-n junction.

* * * * *